(12) United States Patent
Asaba et al.

(10) Patent No.: US 12,382,711 B2
(45) Date of Patent: Aug. 5, 2025

(54) SEMICONDUCTOR DEVICE

(71) Applicants: TOSHIBA ELECTRONIC DEVICES & STORAGE CORPORATION, Tokyo (JP); KABUSHIKI KAISHA TOSHIBA, Tokyo (JP)

(72) Inventors: Shunsuke Asaba, Himeji Hyogo (JP); Hiroshi Kono, Himeji Hyogo (JP); Makoto Mizukami, Ibo Hyogo (JP)

(73) Assignees: Toshiba Electronic Devices & Storage Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 730 days.

(21) Appl. No.: 17/681,587

(22) Filed: Feb. 25, 2022

(65) Prior Publication Data

US 2023/0092735 A1 Mar. 23, 2023

(30) Foreign Application Priority Data

Sep. 22, 2021 (JP) ................. 2021-154471

(51) Int. Cl.
| | |
|---|---|
| *H10D 84/00* | (2025.01) |
| *H10D 62/10* | (2025.01) |
| *H10D 62/17* | (2025.01) |
| *H10D 62/832* | (2025.01) |

(52) U.S. Cl.
CPC ......... *H10D 84/146* (2025.01); *H10D 62/109* (2025.01); *H10D 62/393* (2025.01); *H10D 62/8325* (2025.01)

(58) Field of Classification Search
CPC .. H10D 62/109; H10D 62/128; H10D 62/593; H10D 62/8325; H10D 64/252; H10D 84/146

USPC .......................................................... 257/77
See application file for complete search history.

(56) References Cited

U.S. PATENT DOCUMENTS

| | | | |
|---|---|---|---|
| 7,999,345 | B2 | 8/2011 | Nakazawa et al. |
| 9,887,285 | B1 * | 2/2018 | Oota .................. H01L 29/7805 |
| 2012/0153303 | A1 | 6/2012 | Uchida |
| 2016/0233210 | A1 | 8/2016 | Matocha et al. |
| 2017/0077288 | A1 | 3/2017 | Shimizu et al. |

(Continued)

FOREIGN PATENT DOCUMENTS

| | | |
|---|---|---|
| JP | 2009-253139 A | 10/2009 |
| JP | 2017-055002 A | 3/2017 |

(Continued)

*Primary Examiner* — Fazli Erdem
(74) *Attorney, Agent, or Firm* — Kim & Stewart LLP

(57) ABSTRACT

A semiconductor device of embodiments includes: a first silicon carbide region of first conductive type including a first region in contact with a first face of a silicon carbide layer having first and second faces; a second silicon carbide region of second conductive type above the first silicon carbide region; a third silicon carbide region of second conductive type above the second silicon carbide region; a fourth silicon carbide region of first conductive type above the second silicon carbide region; a first gate electrode and a second gate electrode extending in the first direction; a first electrode on the first face and including a first portion and a second portion between the first and the second gate electrode. The first portion contacts the third and the fourth silicon carbide region. The second portion provided in the first direction of the first portion and contacts with the first region.

12 Claims, 28 Drawing Sheets

(56) References Cited

U.S. PATENT DOCUMENTS

| | | |
|---|---|---|
| 2017/0250275 A1 | 8/2017 | Yen et al. |
| 2019/0371936 A1 | 12/2019 | Nagahisa et al. |
| 2020/0091334 A1 | 3/2020 | Mizukami et al. |
| 2020/0127098 A1 | 4/2020 | Yamashiro et al. |
| 2020/0185517 A1 | 6/2020 | Nakao et al. |
| 2020/0295177 A1 | 9/2020 | Hino et al. |
| 2020/0312995 A1 | 10/2020 | Nagahisa et al. |
| 2022/0013663 A1 | 1/2022 | Kawahara et al. |
| 2022/0190118 A1* | 6/2022 | Asaba .................. H01L 27/088 |
| 2022/0271155 A1* | 8/2022 | Kono .................. H01L 29/063 |

FOREIGN PATENT DOCUMENTS

| | | |
|---|---|---|
| JP | 2018-049951 A | 3/2018 |
| JP | 2018-511184 A | 4/2018 |
| JP | 6611960 B2 | 11/2019 |
| JP | 2020-038944 A | 3/2020 |
| JP | 2020-047680 A | 3/2020 |
| JP | 2020-096202 A | 6/2020 |
| JP | 2020-113633 A | 7/2020 |
| JP | 2020-120129 A | 8/2020 |
| WO | 2018/037701 A1 | 3/2018 |
| WO | 2018/084020 A1 | 5/2018 |
| WO | 2019/124378 A1 | 6/2019 |
| WO | 2020/110285 A1 | 6/2020 |
| WO | 2020/121371 A1 | 6/2020 |

\* cited by examiner

FIG. 14 DD' CROSS SECTION

SEMICONDUCTOR DEVICE

CROSS-REFERENCE TO RELATED APPLICATION

This application is based upon and claims the benefit of priority from Japanese Patent Application No. 2021-154471, filed on Sep. 22, 2021, the entire contents of which are incorporated herein by reference.

FIELD

Embodiments described herein relate generally to a semiconductor device.

BACKGROUND

Silicon carbide is expected as a material for next-generation semiconductor devices. Silicon carbide has excellent physical properties, such as a bandgap of about 3 times that of silicon, a breakdown field strength of about 10 times that of silicon, and a thermal conductivity of about 3 times that of silicon. By using such characteristics, for example, it is possible to realize a metal oxide semiconductor field effect transistor (MOSFET) that has a high breakdown voltage and low loss and that can operate at high temperature.

A vertical MOSFET using silicon carbide has a pn junction diode as a built-in diode. For example, a MOSFET is used as a switching element connected to an inductive load. In this case, even when the MOSFET is in the off state, a reflux current can be made to flow by using a pn junction diode.

However, when a reflux current is made to flow by using a pn junction diode that operates in a bipolar manner, a stacking fault grows in a silicon carbide layer due to the recombination energy of the carriers. When the stacking fault grows in the silicon carbide layer, there arises a problem that the on-resistance of the MOSFET increases. Increasing the on-resistance of the MOSFET leads to a reduction in the reliability of the MOSFET. For example, by providing a Schottky barrier diode (SBD) operating in a unipolar manner in the MOSFET as a built-in diode, it is possible to suppress the growth of a stacking fault in the silicon carbide layer.

DETAILED DESCRIPTION

Figure 1:
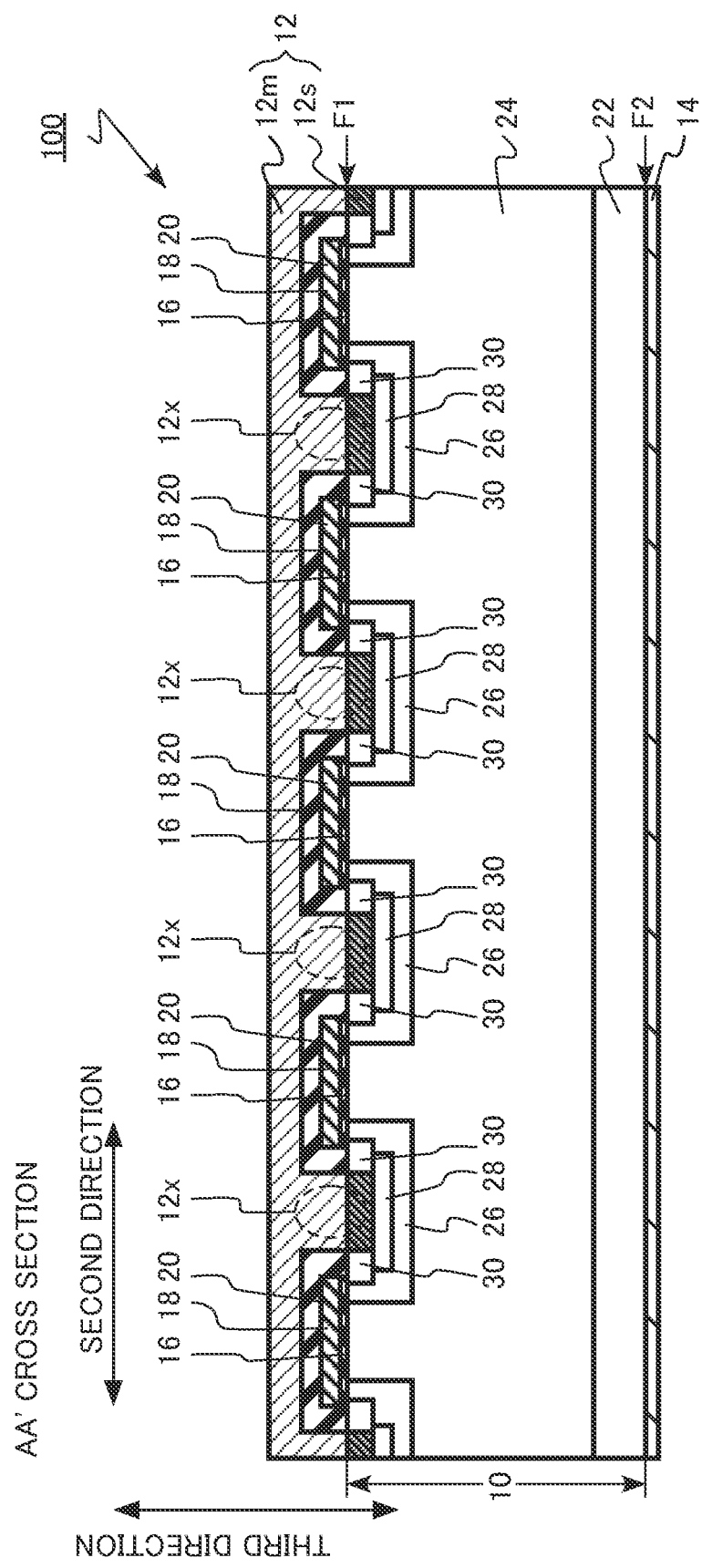
FIG. 1 is a schematic cross-sectional view of a semiconductor device of a first embodiment.

A semiconductor device of embodiments includes: a silicon carbide layer having a first face and a second face facing the first face and including: a first silicon carbide region of a first conductive type including a first region in contact with the first face; a second silicon carbide region of a second conductive type provided between the first silicon carbide region and the first face; a third silicon carbide region of a second conductive type provided between the second silicon carbide region and the first face and having a second conductive type impurity concentration higher than that in the second silicon carbide region; and a fourth silicon carbide region of a first conductive type provided between the second silicon carbide region and the first face and in contact with the first face; a first gate electrode provided on a side of the first face of the silicon carbide layer, extending in a first direction parallel to the first face, and facing the second silicon carbide region on the first face; a second gate electrode provided on the side of the first face of the silicon carbide layer, extending in the first direction, provided in a second direction parallel to the first face and perpendicular to the first direction with respect to the first gate electrode, and facing the second silicon carbide region on the first face;

a first gate insulating layer provided between the second silicon carbide region and the first gate electrode; a second gate insulating layer provided between the second silicon carbide region and the second gate electrode; a first electrode provided on the side of the first face of the silicon carbide layer and including: a first portion provided between the first gate electrode and the second gate electrode and in contact with the third silicon carbide region and the fourth silicon carbide region; and a second portion provided between the first gate electrode and the second gate electrode, provided in the first direction of the first portion, and in contact with the first region; and a second electrode provided on a side of the second face of the silicon carbide layer.

Hereinafter, embodiments will be described with reference to the diagrams. In the following description, the same or similar members and the like may be denoted by the same reference numerals, and the description of the members and the like once described may be omitted as appropriate.

In addition, in the following description, when there are notations of $n^+$, n, $n^-$, $p^+$, p, and $p^-$, these notations indicate the relative high and low of the impurity concentration in each conductive type. That is, $n^+$ indicates that the n-type impurity concentration is relatively higher than n, and $n^-$ indicates that the n-type impurity concentration is relatively lower than n. In addition, $p^+$ indicates that the p-type impurity concentration is relatively higher than p, and $p^-$ indicates that the p-type impurity concentration is relatively lower than p. In addition, $n^+$-type and $n^-$-type may be simply described as n-type, $p^+$-type and $p^-$-type may be simply described as p-type.

The impurity concentration can be measured by, for example, secondary ion mass spectrometry (SIMS). In addition, the relative high and low of the impurity concentration can be determined from, for example, the high and low of the carrier concentration obtained by scanning capacitance microscopy (SCM). In addition, the distance such as the width or depth of an impurity region can be calculated by, for example, SIMS. In addition, the distance such as the width or depth of the impurity region can be calculated from, for example, an SCM image or an image of a scanning electron microscope (SEM). In addition, the thickness of an insulating layer and the like can be measured, for example, on the image of SIMS, SEM, or transmission electron microscope (TEM).

In addition, in this specification, the "p-type impurity concentration" in the p-type silicon carbide region means the net p-type impurity concentration obtained by subtracting the n-type impurity concentration in the region from the p-type impurity concentration in the region. In addition, the "n-type impurity concentration" in the n-type silicon carbide region means the net n-type impurity concentration obtained by subtracting the p-type impurity concentration in the region from the n-type impurity concentration in the region.

In addition, unless otherwise specified in this specification, the impurity concentration in a specific region means the maximum impurity concentration in the region.

First Embodiment

A semiconductor device of a first embodiment includes: a silicon carbide layer having a first face and a second face facing the first face and including: a first silicon carbide region of a first conductive type including a first region in contact with the first face; a second silicon carbide region of a second conductive type provided between the first silicon carbide region and the first face; a third silicon carbide region of a second conductive type provided between the second silicon carbide region and the first face and having a second conductive type impurity concentration higher than that in the second silicon carbide region; and a fourth silicon carbide region of a first conductive type provided between the second silicon carbide region and the first face and in contact with the first face; a first gate electrode provided on a side of the first face of the silicon carbide layer, extending in a first direction parallel to the first face, and facing the second silicon carbide region on the first face; a second gate electrode provided on the side of the first face of the silicon carbide layer, extending in the first direction, provided in a second direction parallel to the first face and perpendicular to the first direction with respect to the first gate electrode, and facing the second silicon carbide region on the first face; a first gate insulating layer provided between the second silicon carbide region and the first gate electrode; a second gate insulating layer provided between the second silicon carbide region and the second gate electrode; a first electrode provided on the side of the first face of the silicon carbide layer and including: a first portion provided between the first gate electrode and the second gate electrode and in contact with the third silicon carbide region and the fourth silicon carbide region; and a second portion provided between the first gate electrode and the second gate electrode, provided in the first direction of the first portion, and in contact with the first region; and a second electrode provided on a side of the second face of the silicon carbide layer.

The semiconductor device of the first embodiment is a planar gate type vertical MOSFET 100 using silicon carbide. The MOSFET 100 of the first embodiment is, for example, a double implantation MOSFET (DIMOSFET) in which a body region and a source region are formed by ion implantation. In addition, the MOSFET 100 of the first embodiment includes an SBD as a built-in diode.

Hereinafter, a case where the first conductive type is n-type and the second conductive type is p-type will be described as an example. The MOSFET 100 is a vertical n-channel MOSFET having electrons as carriers.

Figure 2:
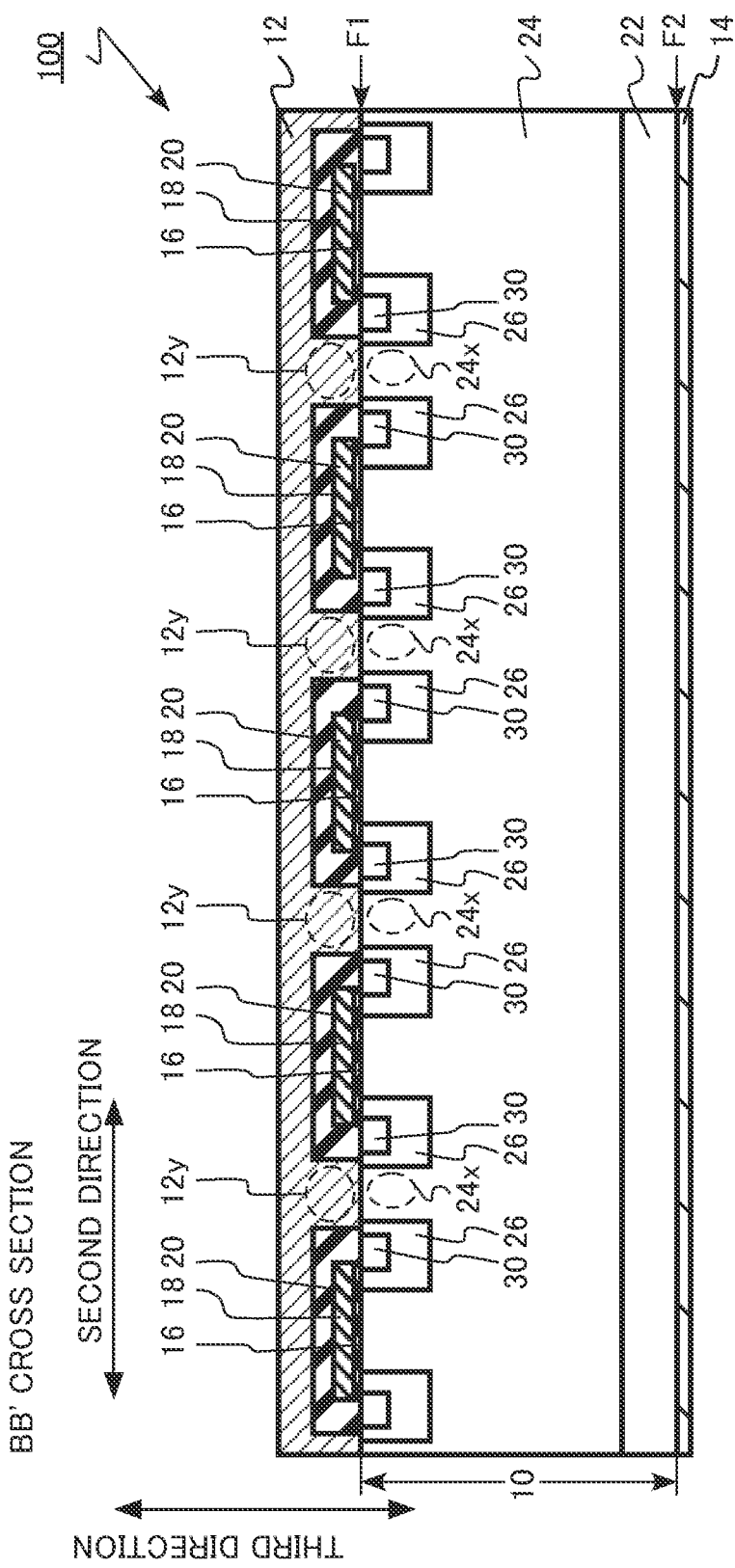
FIG. 2 is a schematic cross-sectional view of the semiconductor device of the first embodiment.
Figure 3:
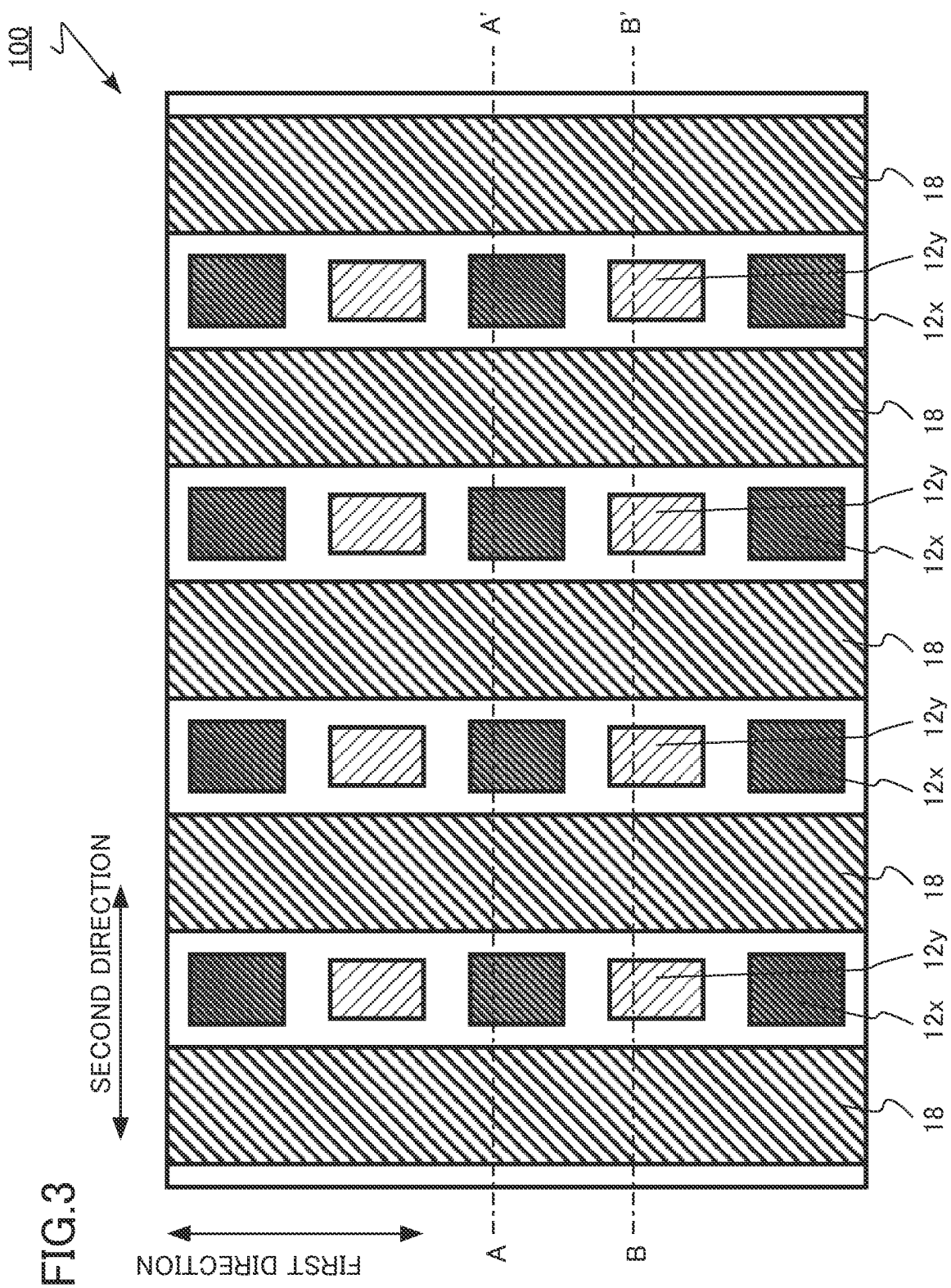
FIG. 3 is a schematic top view of the semiconductor device of the first embodiment.

FIGS. 1 and 2 are schematic cross-sectional views of the semiconductor device of the first embodiment. FIG. 3 is a schematic top view of the semiconductor device of the first embodiment. FIG. 3 is a schematic diagram showing a pattern of a gate electrode and a source electrode on the top surface of a silicon carbide layer. FIG. 1 is a cross-sectional view taken along the line AA' of FIG. 3. FIG. 2 is a cross-sectional view taken along the line BB' of FIG. 3.

Figure 4:
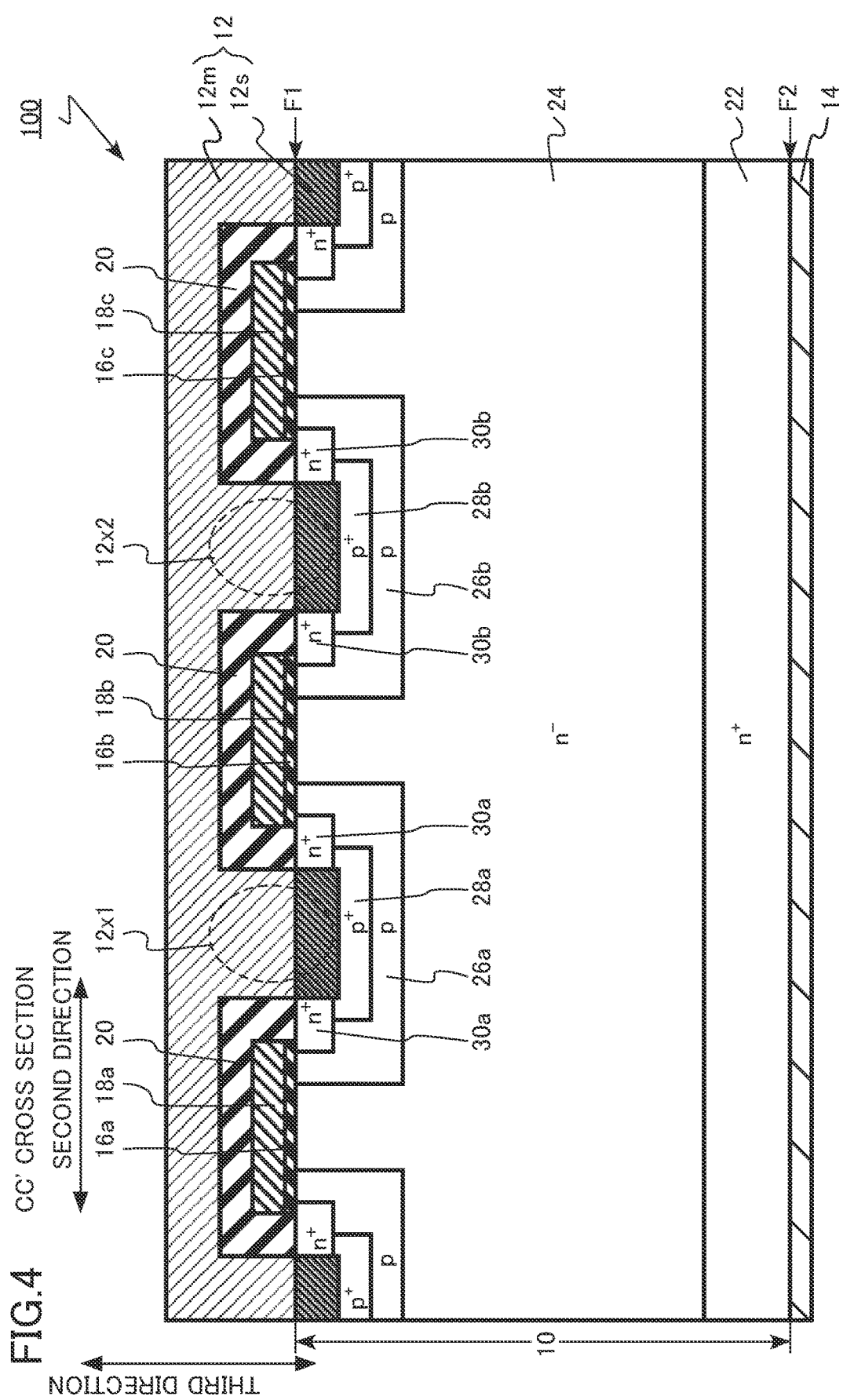
FIG. 4 is an enlarged schematic cross-sectional view of the semiconductor device of the first embodiment.
Figure 5:
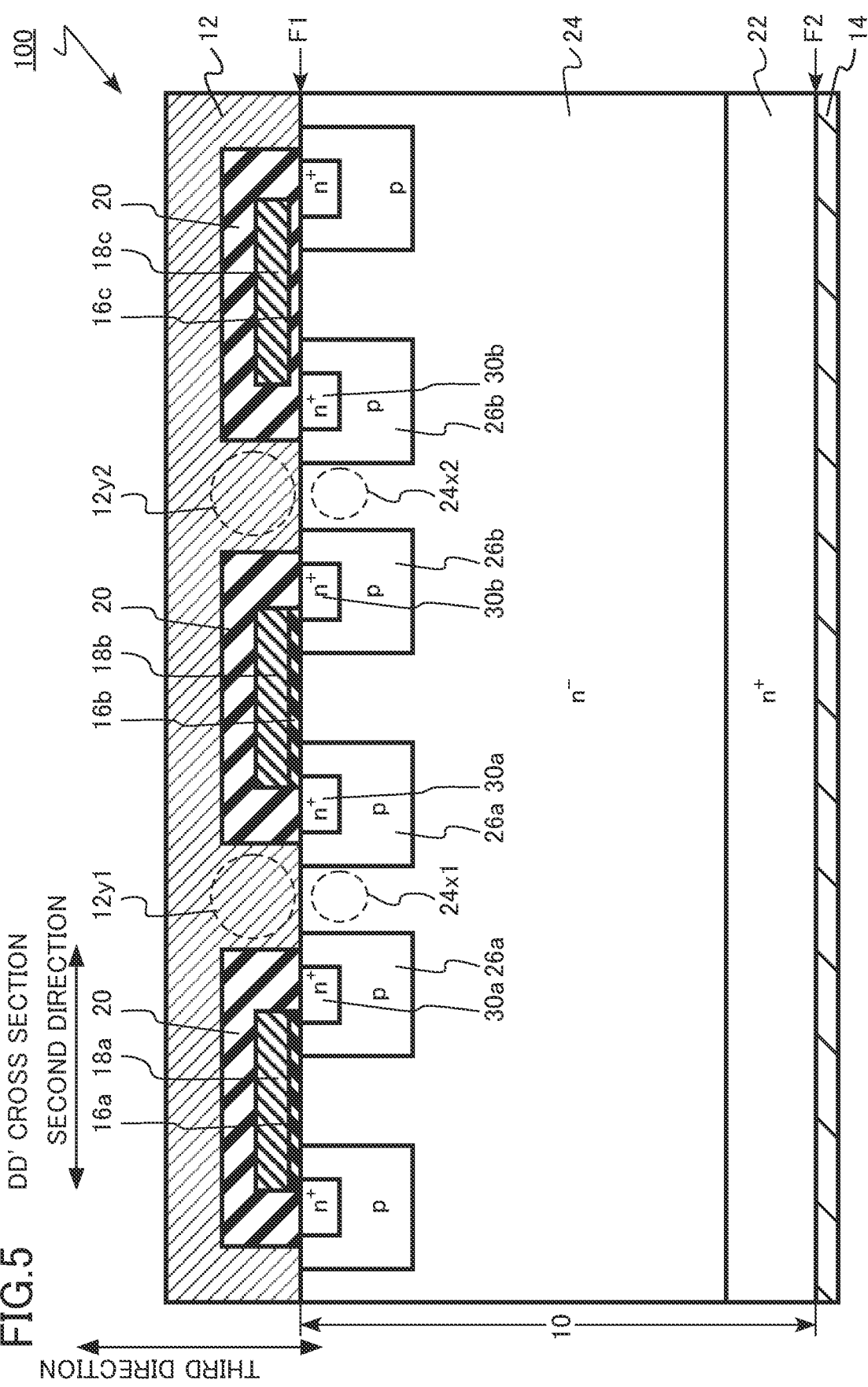
FIG. 5 is an enlarged schematic cross-sectional view of the semiconductor device of the first embodiment.
Figure 6:
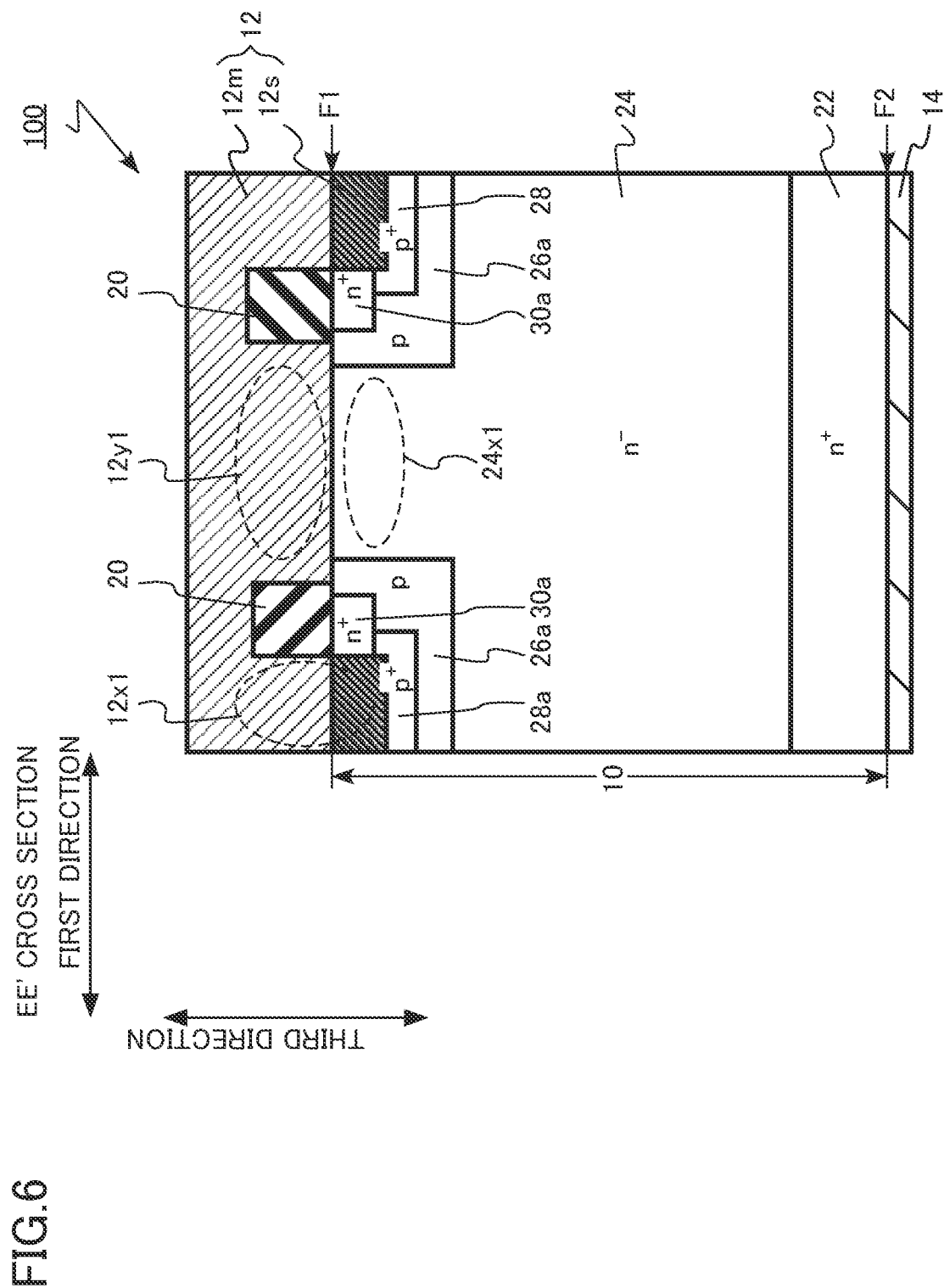
FIG. 6 is an enlarged schematic cross-sectional view of the semiconductor device of the first embodiment.
Figure 7:
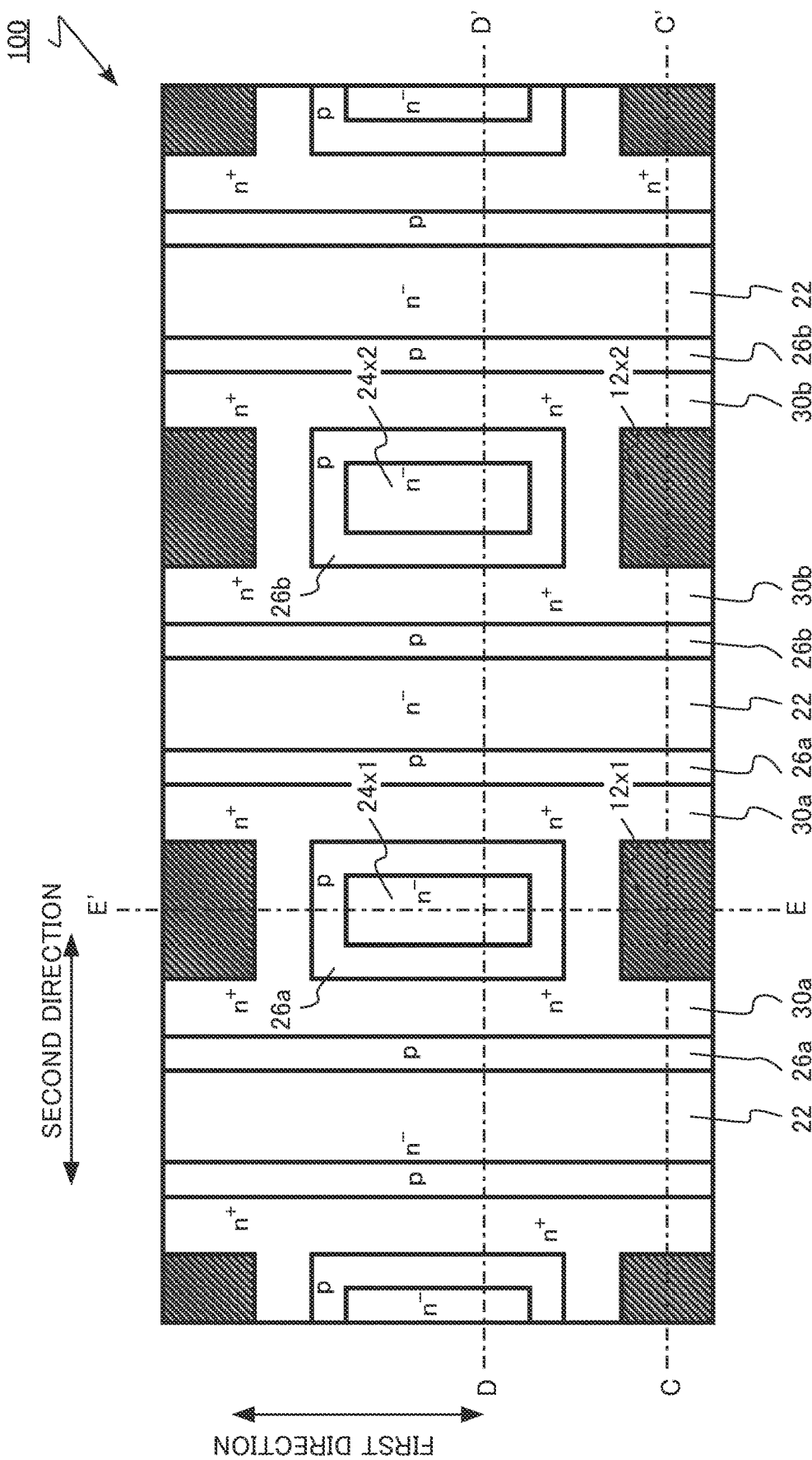
FIG. 7 is an enlarged schematic top view of the semiconductor device of the first embodiment.

FIGS. 4, 5, and 6 are enlarged schematic cross-sectional views of the semiconductor device of the first embodiment. FIG. 7 is an enlarged schematic top view of the semiconductor device of the first embodiment. FIG. 7 is a diagram showing a pattern of a semiconductor region on the surface of a silicon carbide layer. FIG. 4 is a cross-sectional view taken along the line CC' of FIG. 7. FIG. 5 is a cross-sectional view taken along the line DD' of FIG. 7. FIG. 6 is a cross-sectional view taken along the line EE' of FIG. 7.

The MOSFET 100 includes a silicon carbide layer 10, a source electrode 12 (first electrode), a drain electrode 14 (second electrode), a gate insulating layer 16, a gate electrode 18, and an interlayer insulating layer 20. The source electrode 12 includes a metal silicide layer 12s and a metal layer 12m. The source electrode 12 includes a contact electrode portion 12x and a diode electrode portion 12y. The contact electrode portion 12x includes a first contact electrode portion 12x1 (first portion) and a second contact electrode portion 12x2 (third portion). The diode electrode portion 12y includes a first diode electrode portion 12y1 (second portion) and a second diode electrode portion 12y2 (fourth portion). The gate insulating layer 16 includes a first gate insulating layer 16a, a second gate insulating layer 16b, and a third gate insulating layer 16c. The gate electrode 18 includes a first gate electrode 18a, a second gate electrode 18b, and a third gate electrode 18c.

The silicon carbide layer 10 includes an n$^+$-type drain region 22, an n$^-$-type drift region 24 (first silicon carbide region), a p-type body region 26, a p$^+$-type body contact region 28, and an n$^+$-type source region 30. The p-type body region 26 includes a first body region of p-type 26a (second silicon carbide region) and a second body region of p-type 26b (fifth silicon carbide region). The p$^+$-type body contact region 28 includes a first body contact region of p$^+$-type 28a (third silicon carbide region) and a second body contact region of p$^+$-type 28b (sixth silicon carbide region). The n$^+$-type source region 30 includes a first source region of n$^+$-type 30a (fourth silicon carbide region) and a second source region of n$^+$-type 30b (seventh silicon carbide region).

The drift region 24 includes a JBS region 24x. The JBS region 24x includes a first JBS region 24x1 (first region) and a second JBS region 24x2 (second region). In addition, JBS is an abbreviation for Junction Barrier Schottky.

The source electrode 12 is an example of the first electrode. The first contact electrode portion 12x1 is an example of the first portion. The second contact electrode portion 12x2 is an example of the third portion. The first diode electrode portion 12y1 is an example of the second portion. The second diode electrode portion 12y2 is an example of the fourth portion. The drain electrode 14 is an example of the second electrode. The drift region 24 is an example of the first silicon carbide region. The first JBS region 24x1 is an example of the first region. The second JBS region 24x2 is an example of the second region. The first body region 26a is an example of the second silicon carbide region. The first body contact region 28a is an example of the third silicon carbide region. The first source region 30a is an example of the fourth silicon carbide region. The second body region 26b is an example of the fifth silicon carbide region. The second body contact region 28b is an example of the sixth silicon carbide region. The second source region 30b is an example of the seventh silicon carbide region.

The silicon carbide layer 10 is provided between the source electrode 12 and the drain electrode 14. The silicon carbide layer 10 is a single crystal SiC. The silicon carbide layer 10 is, for example, 4H—SiC.

The silicon carbide layer 10 includes a first face ("F1" in FIG. 1) and a second face ("F2" in FIG. 1). Hereinafter, the first face F1 may be referred to as a surface, and the second face F2 may be referred to as a back surface. The first face F1 is disposed on the source electrode 12 side of the silicon carbide layer 10. In addition, the second face F2 is disposed on the drain electrode 14 side of the silicon carbide layer 10. The first face F1 and the second face F2 face each other. Hereinafter, the "depth" means a depth in a direction toward the second face with the first face as a reference.

The first and second directions are parallel to a first face F1. The second direction is perpendicular to the first direction.

The first face F1 is, for example, a face inclined by an angle equal to or more than 0° and equal to or less than 8° with respect to the (0001) face. In addition, the second face F2 is, for example, a face inclined by an angle equal to or more than 0° and equal to or less than 8° with respect to the (000-1) face. The (0001) face is referred to as a silicon face. The (000-1) face is referred to as a carbon face.

The n$^+$-type drain region 22 is provided on the back surface side of the silicon carbide layer 10. The drain region 22 contains, for example, nitrogen (N) as an n-type impurity. The n-type impurity concentration in the drain region 22 is equal to or more than $1\times10^{18}$ cm$^{-3}$ and equal to or less than $1\times10^{21}$ cm$^{-3}$, for example.

The n$^-$-type drift region 24 is provided between the drain region 22 and the first face F1. The n$^-$-type drift region 24 is provided between the source electrode 12 and the drain electrode 14. The n$^-$-type drift region 24 is provided between the gate electrode 18 and the drain electrode 14.

The n$^-$-type drift region 24 is provided on the drain region 22. The drift region 24 contains, for example, nitrogen (N) as an n-type impurity. The n-type impurity concentration in the drift region 24 is lower than the n-type impurity concentration in the drain region 22. The n-type impurity concentration in the drift region 24 is equal to or more than $4\times10^{14}$ cm$^{-3}$ and equal to or less than $1\times10^{17}$ cm$^{-3}$, for example. The thickness of the drift region 24 is equal to or more than 3 μm and equal to or less than 150 μm, for example.

The n$^-$-type drift region 24 includes the JBS region 24x. The JBS region 24x includes the first JBS region 24x1 (first region) and the second JBS region 24x2 (second region).

The JBS region 24x is in contact with the first face F1. The JBS region 24x is surrounded by the body region 26. For example, the first JBS region 24x1 is surrounded by the first body region 26a. For example, the second JBS region 24x2 is surrounded by the second body region 26b.

The JBS region 24x is in contact with the diode electrode portion 12y of the source electrode 12. For example, the first JBS region 24x1 is in contact with the first diode electrode portion 12y1. For example, the second JBS region 24x2 is in contact with the second diode electrode portion 12y2. The JBS region 24x functions as a cathode region of the SBD.

The p-type body region 26 is provided between the drift region 24 and the first face F1. The body region 26 extends in the first direction. The body region 26 functions as a channel region of the MOSFET 100.

The first body region 26a is provided between the drift region 24 and the first face F1. The second body region 26b is provided between the drift region 24 and the first face F1. The second body region 26b is spaced from the first body region 26a in the second direction.

The body region 26 contains, for example, aluminum (Al) as a p-type impurity. The p-type impurity concentration in the body region 26 is equal to or more than $5\times10^{16}$ cm$^{-3}$ and equal to or less than $5\times10^{19}$ cm$^{-3}$, for example.

The depth of the body region 26 is equal to or more than 500 nm and equal to or less than 900 nm, for example.

The body region 26 is electrically connected to the source electrode 12. The body region 26 is fixed to the electric potential of the source electrode 12.

A part of the body region 26 is in contact with the first face F1. A part of the body region 26 faces the gate electrode 18. A part of the body region 26 becomes a channel region of the MOSFET 100. The gate insulating layer 16 is interposed between a part of the body region 26 and the gate electrode 18.

The p$^+$-type body contact region 28 is provided between the body region 26 and the first face F1. The body contact region 28 is provided between the body region 26 and the contact electrode portion 12x of the source electrode 12.

The first body contact region 28a is provided between the first body region 26a and the first face F1. The first body contact region 28a is provided between the first body region 26a and the first contact electrode portion 12x1.

The second body contact region 28b is provided between the second body region 26b and the first face F1. The second body contact region 28b is provided between the second body region 26b and the second contact electrode portion 12x2.

The p-type impurity concentration in the body contact region 28 is higher than the p-type impurity concentration in the body region 26.

The body contact region 28 contains, for example, aluminum (Al) as a p-type impurity. The p-type impurity concentration in the body contact region 28 is equal to or more than $1\times10^{19}$ cm$^{-3}$ and equal to or less than $5\times10^{21}$ cm$^{-3}$, for example.

The depth of the body contact region 28 is equal to or more than 200 nm and equal to or less than 500 nm, for example.

The body contact region 28 is in contact with the source electrode 12. The body contact region 28 is electrically connected to the source electrode 12. The contact between the body contact region 28 and the source electrode 12 is, for example, an ohmic contact. The body contact region 28 is fixed to the electric potential of the source electrode 12.

The body contact region 28 is in contact with the contact electrode portion 12x of the source electrode 12. The first body contact region 28a is in contact with the first contact electrode portion 12x1. The second body contact region 28b is in contact with the second contact electrode portion 12x2.

The n$^+$-type source region 30 is provided between the body region 26 and the first face F1. The n$^+$-type source region 30 is provided, for example, between the body contact region 28 and the first face F1.

The first source region 30a is provided between the first body region 26a and the first face F1. The first source region 30a is provided, for example, between the first body contact region 28a and the first face F1.

The second source region 30b is provided between the second body region 26b and the first face F1. The second source region 30b is provided, for example, between the second body contact region 28b and the first face F1.

The source region 30 contains, for example, phosphorus (P) or nitrogen (N) as an n-type impurity. The n-type impurity concentration in the source region 30 is higher than the n-type impurity concentration in the drift region 24.

The n-type impurity concentration in the source region 30 is equal to or more than $1\times10^{19}$ cm$^{-3}$ and equal to or less than $5\times10^{21}$ cm$^{-3}$, for example. The depth of the source region 30 is smaller than the depth of the body region 26. The depth of the source region 30 is equal to or more than 80 nm and equal to or less than 200 nm, for example.

The source region 30 is in contact with the source electrode 12. The source region 30 is electrically connected to the source electrode 12. The contact between the source region 30 and the source electrode 12 is, for example, an ohmic contact. The source region 30 is fixed to the electric potential of the source electrode 12.

The source region 30 is in contact with the contact electrode portion 12x of the source electrode 12. The first source region 30a is in contact with the first contact electrode portion 12x1. The second source region 30b is in contact with the second contact electrode portion 12x2.

The gate electrode 18 is provided on the first face F1 side of the silicon carbide layer 10. The gate electrode 18 extends in the first direction. A plurality of gate electrodes 18 are arranged in parallel with each other in the second direction. The gate electrode 18 faces the body region 26 on the first face F1.

The first gate electrode 18a extends in the first direction. The first gate electrode 18a faces the first body region 26a on the first face F1.

The second gate electrode 18b extends in the first direction. The second gate electrode 18b is provided in the second direction with respect to the first gate electrode 18a. The second gate electrode 18b faces the first body region 26a and the second body region 26b on the first face F1.

The third gate electrode 18c extends in the first direction. The third gate electrode 18c is provided in the second direction with respect to the second gate electrode 18b. The second gate electrode 18b is provided between the first gate electrode 18a and the third gate electrode 18c. The third gate electrode 18c faces the second body region 26b on the first face F1.

The gate electrode 18 is a conductive layer. The gate electrode 18 is, for example, polycrystalline silicon containing p-type impurities or n-type impurities.

The gate insulating layer 16 is provided between the gate electrode 18 and the body region 26. The first gate insulating layer 16a is provided between the first gate electrode 18a and the first body region 26a. The second gate insulating layer 16b is provided between the second gate electrode 18b and the first body region 26a. The second gate insulating layer 16b is provided between the second gate electrode 18b and the second body region 26b. The third gate insulating layer 16c is provided between the third gate electrode 18c and the second body region 26b.

The gate insulating layer 16 contains, for example, silicon oxide. The gate insulating layer 16 includes, for example, a silicon oxide layer. For example, an insulating material with a high dielectric constant can be applied to the gate insulating layer 16. In addition, for example, a stacked structure of a silicon oxide layer and an insulating layer with a high dielectric constant can be applied to the gate insulating layer 16.

The thickness of the gate insulating layer 16 is equal to or more than 30 nm and equal to or less than 100 nm, for example.

The interlayer insulating layer 20 is provided on the gate electrode 18. The interlayer insulating layer 20 is provided between the gate electrode 18 and the source electrode 12.

The interlayer insulating layer 20 electrically separates the gate electrode 18 and the source electrode 12 from each other. The interlayer insulating layer 20 contains, for example, silicon oxide. The interlayer insulating layer 20 is, for example, a silicon oxide layer.

The source electrode 12 is provided on the first face F1 side of the silicon carbide layer 10. The source electrode 12 is in contact with the silicon carbide layer 10. The source electrode 12 is in contact with the body contact region 28 and the source region 30.

The source electrode 12 includes the contact electrode portion 12x and the diode electrode portion 12y.

The contact electrode portion 12x is provided between the two gate electrodes 18. The contact electrode portion 12x is in contact with the body contact region 28 and the source region 30.

For example, the interface between the contact electrode portion 12x and the body contact region 28 is disposed closer to the second face F2 than the first face F1 in the third direction perpendicular to the first face F1. For example, the contact electrode portion 12x is in contact with the source region 30 in the second direction.

The first contact electrode portion 12x1 is provided between the first gate electrode 18a and the second gate electrode 18b. The first contact electrode portion 12x1 is in contact with the first body contact region 28a and the first source region 30a.

For example, the interface between the first contact electrode portion 12x1 and the first body contact region 28a is disposed closer to the second face F2 than the first face F1 in the third direction perpendicular to the first face F1. For example, the first contact electrode portion 12x1 is in contact with the first source region 30a in the second direction.

The second contact electrode portion 12x2 is provided between the second gate electrode 18b and the third gate electrode 18c. The second contact electrode portion 12x2 is in contact with the second body contact region 28b and the second source region 30b.

For example, the interface between the second contact electrode portion 12x2 and the second body contact region 28b is disposed closer to the second face F2 than the first face F1 in the third direction perpendicular to the first face F1. For example, the second contact electrode portion 12x2 is in contact with the second source region 30b in the second direction.

The diode electrode portion 12y is provided between the two gate electrodes 18. The diode electrode portion 12y is provided in the first direction of the contact electrode portion 12x.

The contact electrode portion 12x and the diode electrode portion 12y are alternately and repeatedly arranged in the first direction between the same two gate electrodes 18.

The diode electrode portion 12y is in contact with the JBS region 24x of the drift region 24. The diode electrode portion 12y functions as an anode electrode of the SBD.

The first diode electrode portion 12y1 is provided between the first gate electrode 18a and the second gate electrode 18b. The first diode electrode portion 12y1 is provided in the first direction of the first contact electrode portion 12x1. The first diode electrode portion 12y1 is in contact with the first JBS region 24x1 of the drift region 24.

The second diode electrode portion 12y2 is provided between the second gate electrode 18b and the third gate electrode 18c. The second diode electrode portion 12y2 is provided in the first direction of the second contact electrode portion 12x2. The second diode electrode portion 12y2 is in contact with the second JBS region 24x2 of the drift region 24.

The source electrode 12 includes the metal silicide layer 12s and the metal layer 12m. The metal silicide layer 12s is provided between the silicon carbide layer 10 and the metal layer 12m.

The metal silicide layer 12s is in contact with the body contact region 28. The metal silicide layer 12s is in contact with the source region 30.

The metal silicide layer 12s contains, for example, nickel (Ni), titanium (Ti), or cobalt (Co). The metal silicide layer 12s is, for example, a nickel silicide layer, a titanium silicide layer, or a cobalt silicide layer.

The metal layer 12m contains metal. The metal layer 12m has, for example, a stacked structure of a barrier metal film and a metal film.

The barrier metal film contains, for example, titanium (Ti), tungsten (W), or tantalum (Ta). The barrier metal film is, for example, a titanium film, a titanium nitride film, a tungsten nitride film, or a tantalum nitride film.

The metal film contains, for example, aluminum (Al). The metal film is, for example, an aluminum film.

The contact electrode portion 12x includes the metal silicide layer 12s. The first contact electrode portion 12x1 includes the metal silicide layer 12s. The second contact electrode portion 12x2 includes the metal silicide layer 12s.

Since the contact electrode portion 12x includes the metal silicide layer 12s, ohmic contact is formed between the source electrode 12 and the body contact region 28 and between the source electrode 12 and the source region 30.

The diode electrode portion 12y includes, for example, a barrier metal film. The first diode electrode portion 12y1 includes, for example, a barrier metal film. The second diode electrode portion 12y2 includes, for example, a barrier metal film.

For example, when the diode electrode portion 12y includes a barrier metal film, Schottky contact is formed between the source electrode 12 and the JBS region 24x.

The drain electrode 14 is provided on the second face F2 side of the silicon carbide layer 10. The drain electrode 14 is provided on the second face F2 of the silicon carbide layer 10. The drain electrode 14 is in contact with the second face F2.

The drain electrode 14 contains, for example, a metal or a metal semiconductor compound. The drain electrode 14 includes, for example, a nickel silicide layer, a titanium layer, a nickel layer, a silver layer, or a gold layer.

The drain electrode 14 is electrically connected to the drain region 22. The drain electrode 14 is in contact with, for example, the drain region 22.

Next, the function and effect of the MOSFET 100 of the first embodiment will be described.

Figure 8:
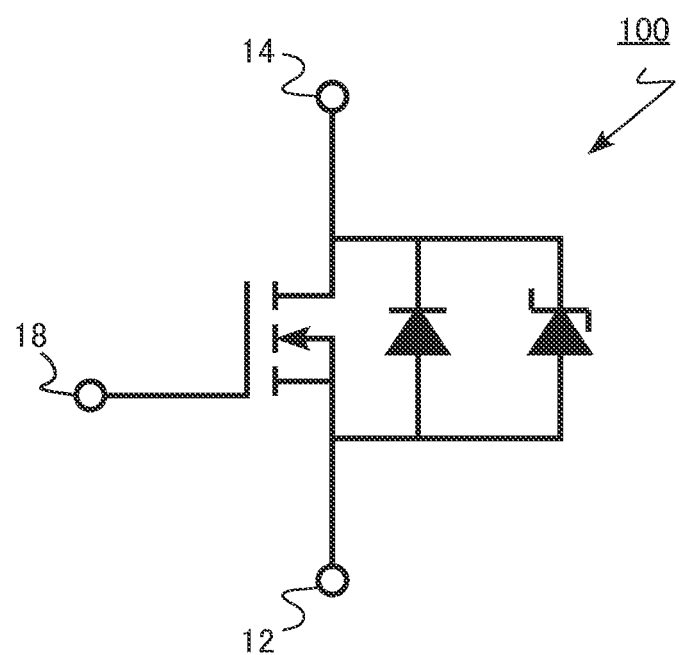
FIG. 8 is an equivalent circuit diagram of the semiconductor device of the first embodiment.

FIG. 8 is an equivalent circuit diagram of the semiconductor device of the first embodiment. In the MOSFET 100, between the source electrode 12 and the drain electrode 14, a pn diode and an SBD are connected as built-in diodes in parallel with a transistor. The body region 26 is an anode region of the pn junction diode, and the drift region 24 is a cathode region of the pn junction diode. In addition, the source electrode 12 is an anode electrode of the SBD, and the JBS region 24x is a cathode region of the SBD.

For example, a case where the MOSFET 100 is used as a switching element connected to an inductive load is considered. When the MOSFET 100 is turned off, a voltage that is positive with respect to the drain electrode 14 may be applied to the source electrode 12 due to an induced current caused by an inductive load. In this case, a forward current flows through the built-in diode. This state is also referred to as a reverse conduction state.

If the MOSFET does not include an SBD, a forward current flows through the pn junction diode. The pn junction diode operates in a bipolar manner. When a reflux current is made to flow by using a pn junction diode that operates in a bipolar manner, a stacking fault grows in a silicon carbide layer due to the recombination energy of the carriers. When the stacking fault grows in the silicon carbide layer, there arises a problem that the on-resistance of the MOSFET increases. Increasing the on-resistance of the MOSFET leads to a reduction in the reliability of the MOSFET.

The MOSFET 100 includes an SBD. A forward voltage (Vf) at which a forward current starts to flow through the SBD is lower than a forward voltage (Vf) of the pn junction diode. Therefore, a forward current flows through the SBD prior to the pn junction diode.

The forward voltage (Vf) of the SBD is equal to or more than 1.0 V and less than 2.0 V, for example. The forward voltage (Vf) of the pn junction diode is equal to or more than 2.0 V and equal to or less than 3.0 V, for example.

The SBD operates in a unipolar manner. Therefore, even if a forward current flows, no stacking fault grows in the silicon carbide layer 10 due to the recombination energy of the carriers. Therefore, the increase in the on-resistance of the MOSFET 100 is suppressed. As a result, the reliability of the MOSFET 100 is improved.

Figure 9:
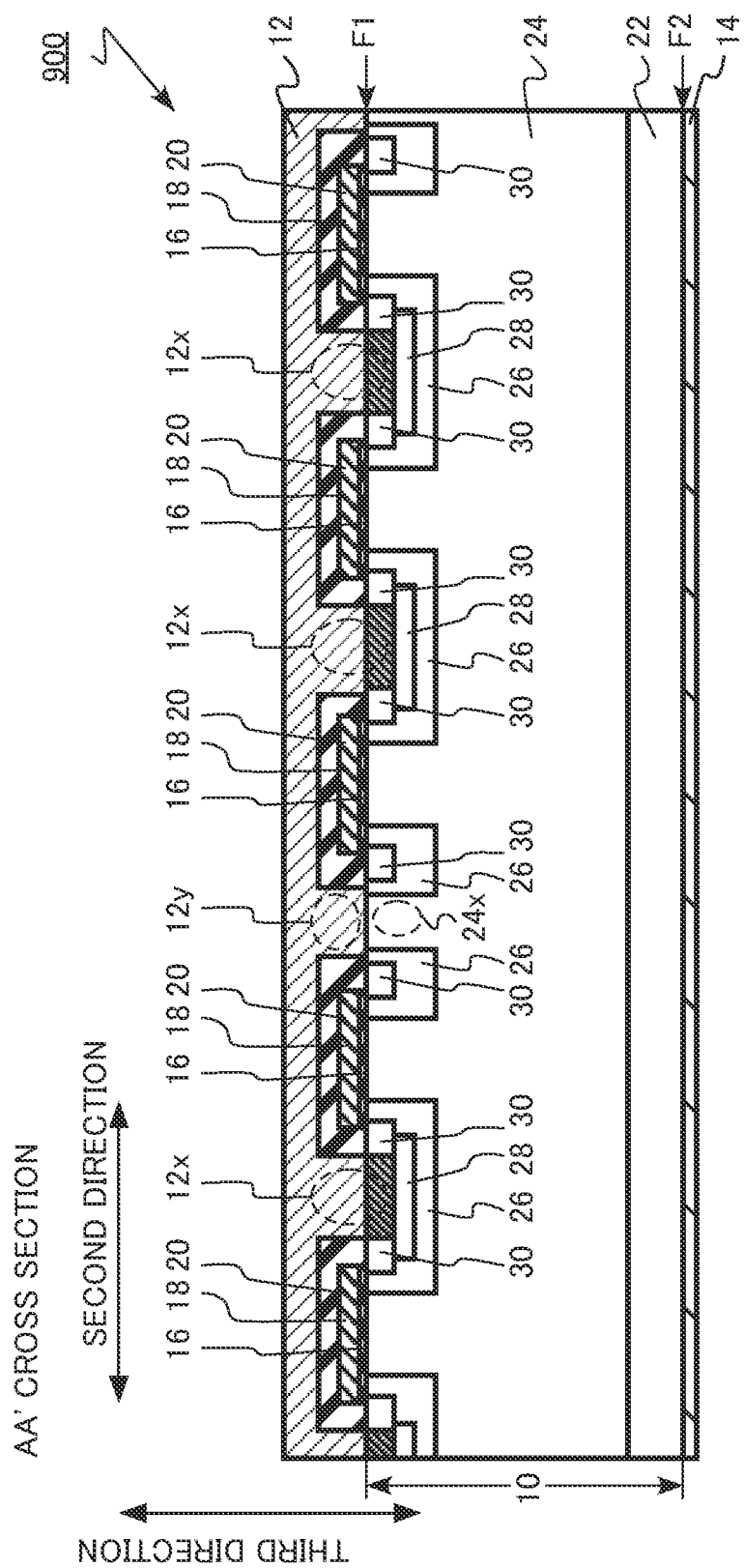
FIG. 9 is a schematic cross-sectional view of a semiconductor device of a comparative example of the first embodiment.
Figure 10:
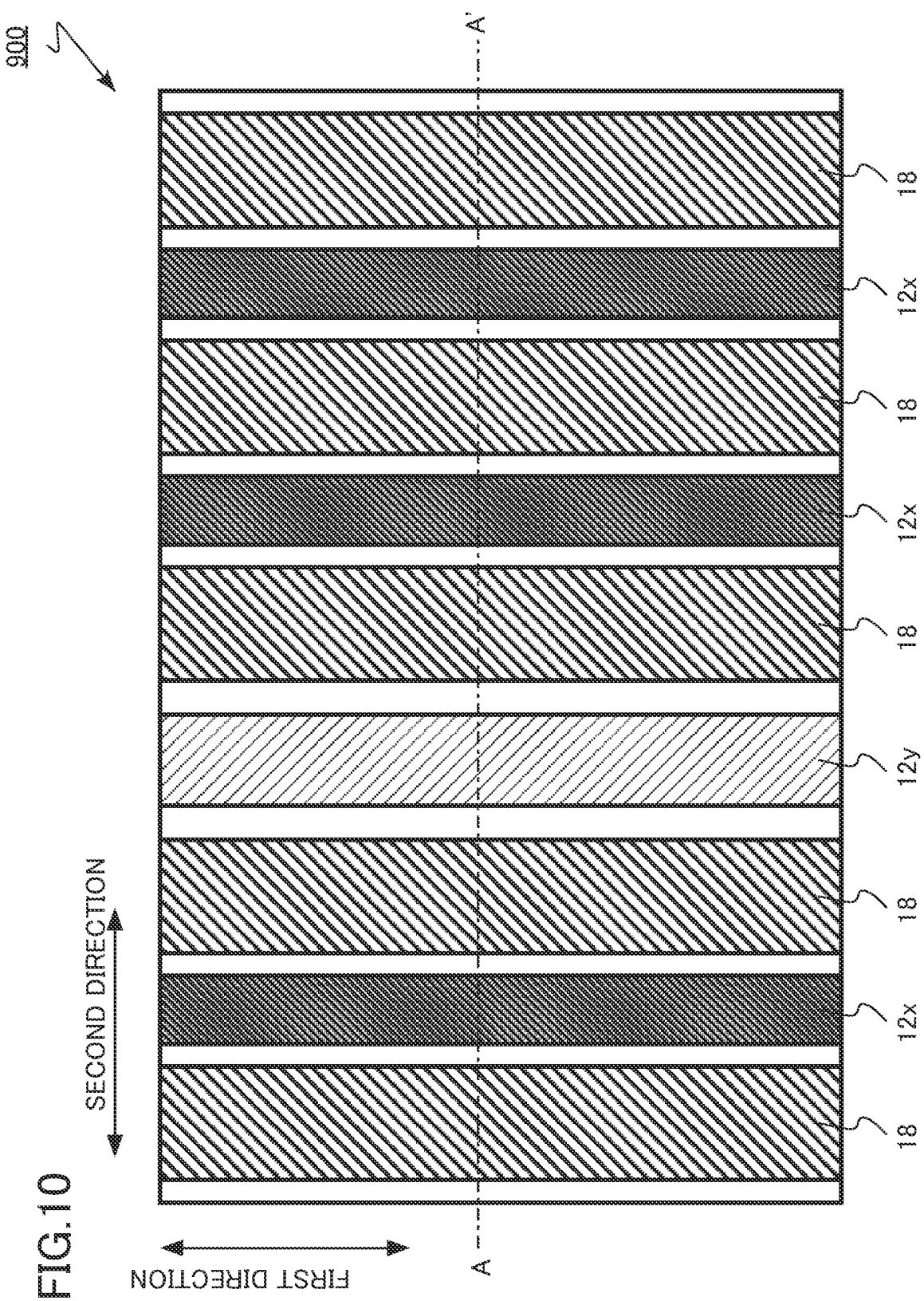
FIG. 10 is a schematic top view of a semiconductor device of a comparative example of the first embodiment.

FIG. 9 is a schematic cross-sectional view of a semiconductor device of a comparative example of the first embodiment. FIG. 9 is a diagram corresponding to FIGS. 1 and 2 of the first embodiment. FIG. 10 is a schematic top view of the semiconductor device of the comparative example of the first embodiment. FIG. 10 is a schematic diagram showing a pattern of a gate electrode and a source electrode on the top surface of a silicon carbide layer. FIG. 10 is a diagram corresponding to FIG. 3 of the first embodiment. FIG. 9 is a cross-sectional view taken along the line AA' of FIG. 10.

The semiconductor device of the comparative example is a planar gate type vertical MOSFET 900 using silicon carbide. The MOSFET 900 of the comparative example is a DIMOSFET. In addition, the MOSFET 900 of the comparative example includes an SBD as a built-in diode.

The MOSFET 900 of the comparative example is different from the MOSFET 100 of the first embodiment in that only one of the contact electrode portion 12x and the diode electrode portion 12y is present between the two gate electrodes 18 adjacent to each other. Between the two gate electrodes 18, the contact electrode portion 12x extends in the first direction. Between the two gate electrodes 18, the diode electrode portion 12y extends in the first direction.

In the MOSFET 900 of the comparative example, when trying to change the ratio between the transistor and the SBD, that is, when trying to change the ratio between the contact electrode portion 12x and the diode electrode portion 12y, the number of gate electrodes 18 interposed between adjacent SBDs is changed. For example, when trying to reduce the ratio between SBDs, the number of gate electrodes 18 between adjacent SBDs is changed in a direction of increasing the number of gate electrodes 18, such as 2 to 3 or 3 to 4. For this reason, the degree of freedom in designing the ratio between the transistor and the SBD is reduced.

In addition, in the MOSFET having a built-in SBD, when the SBD is forward-biased, the current flowing through the SBD flows through the bottom of the body region 26, so that the increase in the voltage applied to the pn junction between the body region 26 and the drift region 24 is suppressed. By suppressing the increase in the voltage applied to the pn junction, the pn junction diode is suppressed from being turned on. By suppressing the pn junction diode from being turned on, the injection of holes from the body region 26 into the drift region 24 is suppressed. By suppressing the holes injected into the drift region 24, the growth of a stacking fault in the silicon carbide layer is suppressed, and accordingly, a reduction in reliability is suppressed.

When the distance from the SBD to the body region 26 increases, the increase in the voltage applied to the pn junction cannot be sufficiently suppressed, so that the pn junction diode is easily turned on. Therefore, the reliability may be reduced.

In the MOSFET 900 of the comparative example, in particular, when the number of gate electrodes 18 interposed between adjacent SBDs is increased in order to reduce the ratio between SBDs, the distance from the SBDs to the body region 26 is significantly increased. Therefore, in the MOSFET 900, there is a concern that the pn junction diode will be turned on to reduce the reliability.

In the MOSFET 100 of the first embodiment, the contact electrode portion 12x and the diode electrode portion 12y are alternately and repeatedly arranged in the first direction between the same two gate electrodes 18. In the MOSFET 100 of the first embodiment, when trying to change the ratio between the transistor and the SBD, the ratio between the contact electrode portion 12x and the diode electrode portion 12y in the first direction is changed. The ratio between the contact electrode portion 12x and the diode electrode portion 12y can be any ratio. Therefore, as compared with the MOSFET 900 of the comparative example, the degree of freedom in designing the ratio between the transistor and the SBD increases.

In addition, in the MOSFET 100 of the first embodiment, the contact electrode portion 12x and the diode electrode portion 12y are alternately and repeatedly arranged in the first direction between the same two gate electrodes 18. Therefore, it is possible to reduce the distance from the SBD to the body region 26 as compared with the MOSFET 900 of the comparative example. As a result, the MOSFET 100 of the first embodiment has improved reliability as compared with the MOSFET 900 of the comparative example.

As described above, according to the first embodiment, a MOSFET with improved reliability is realized.

Second Embodiment

A semiconductor device of a second embodiment is different from the semiconductor device of the first embodiment in that the third portion is disposed in the second direction of the second portion. Hereinafter, the description of a part of the content overlapping the first embodiment may be omitted.

The semiconductor device of the second embodiment is a planar gate type vertical MOSFET 200 using silicon carbide. The MOSFET 200 of the second embodiment is a DIMOSFET. In addition, the MOSFET 200 of the second embodiment includes an SBD as a built-in diode.

Figure 11:
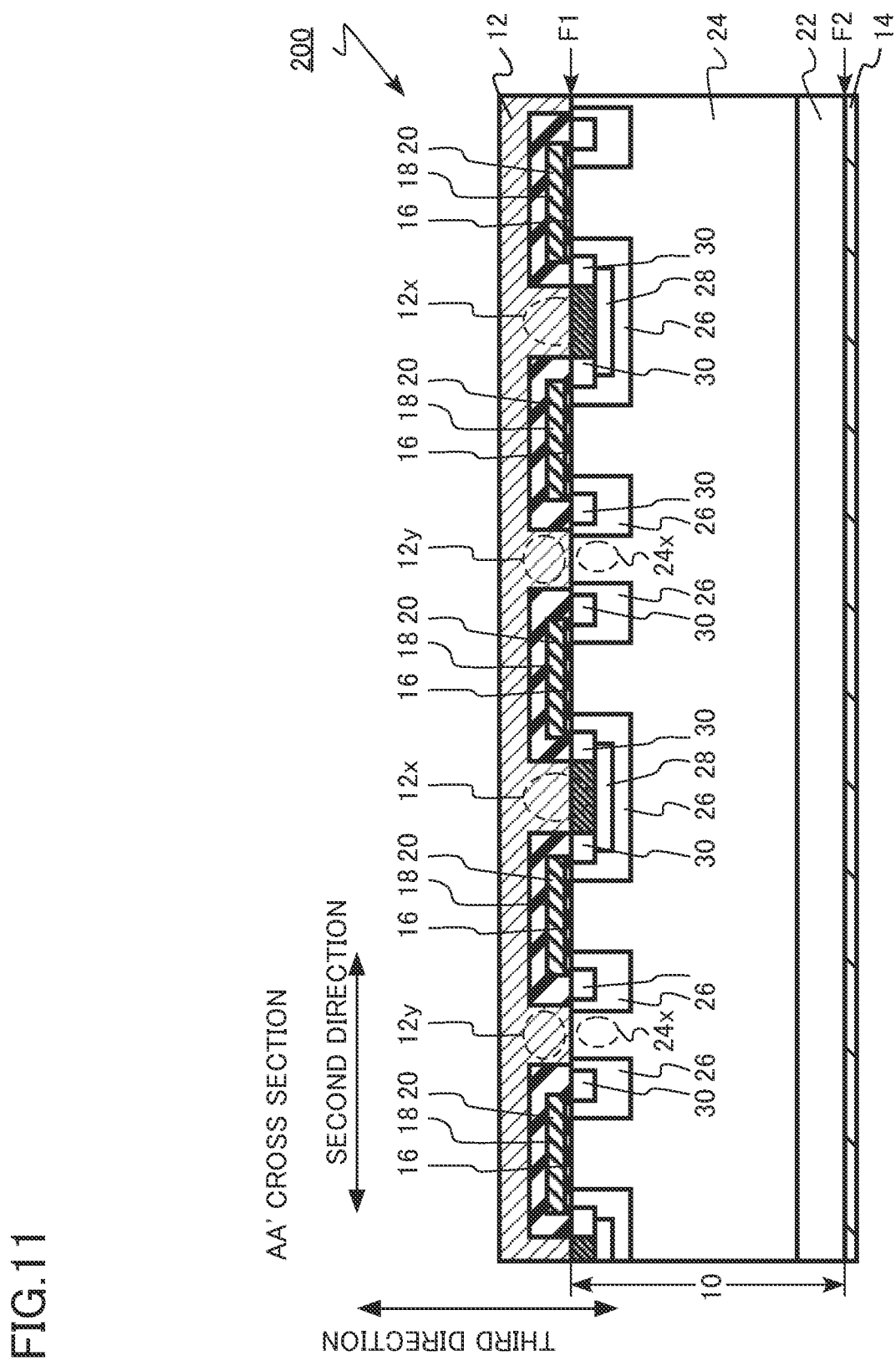
FIG. 11 is a schematic cross-sectional view of a semiconductor device of a second embodiment.
Figure 12:
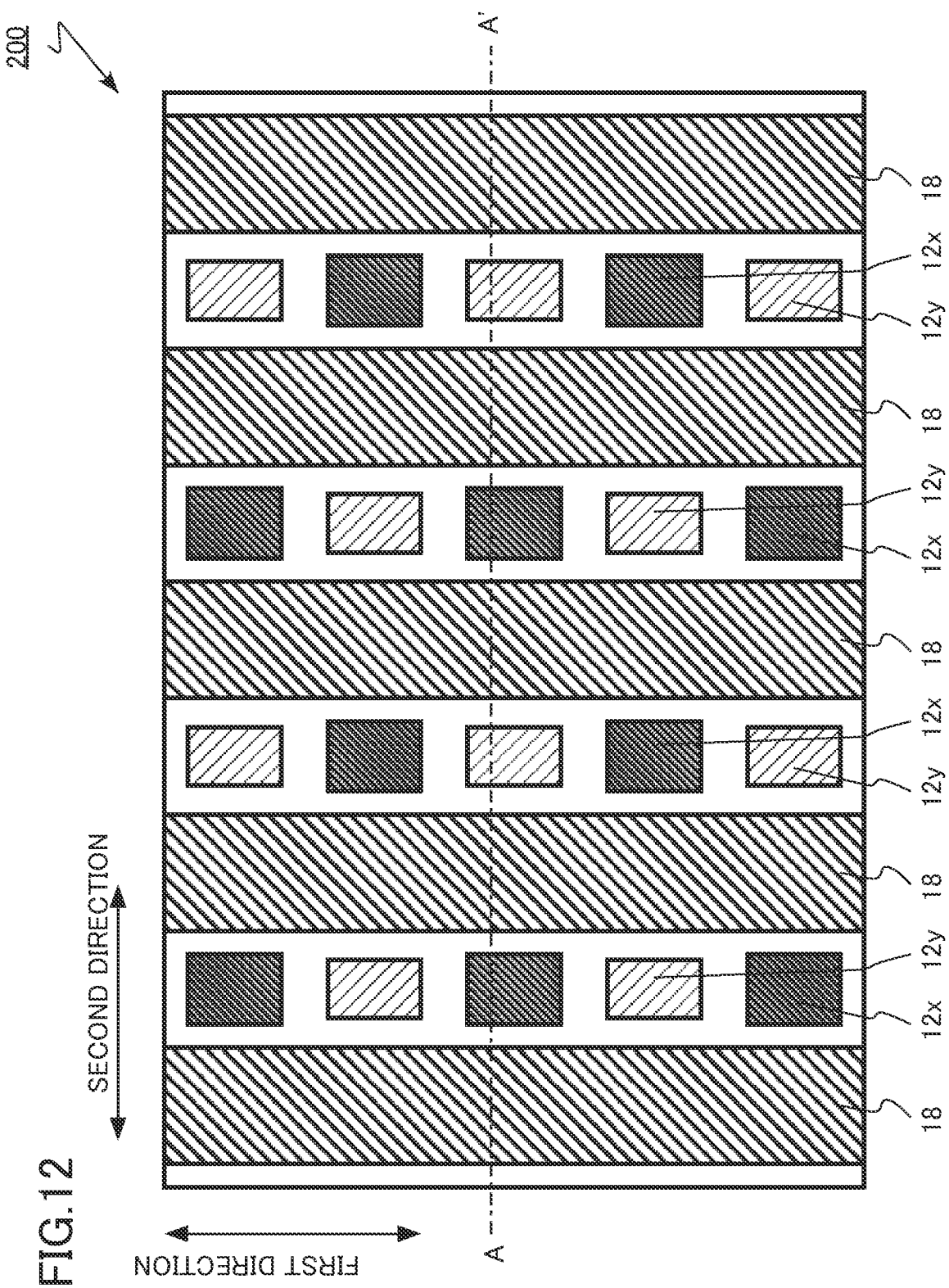
FIG. 12 is a schematic top view of the semiconductor device of the second embodiment.

FIG. 11 is a schematic cross-sectional view of the semiconductor device of the second embodiment. FIG. 12 is a schematic top view of the semiconductor device of the second embodiment. FIG. 12 is a schematic diagram showing a pattern of a gate electrode and a source electrode on the top surface of a silicon carbide layer. FIG. 11 is a cross-sectional view taken along the line AA' of FIG. 12.

Figure 13:
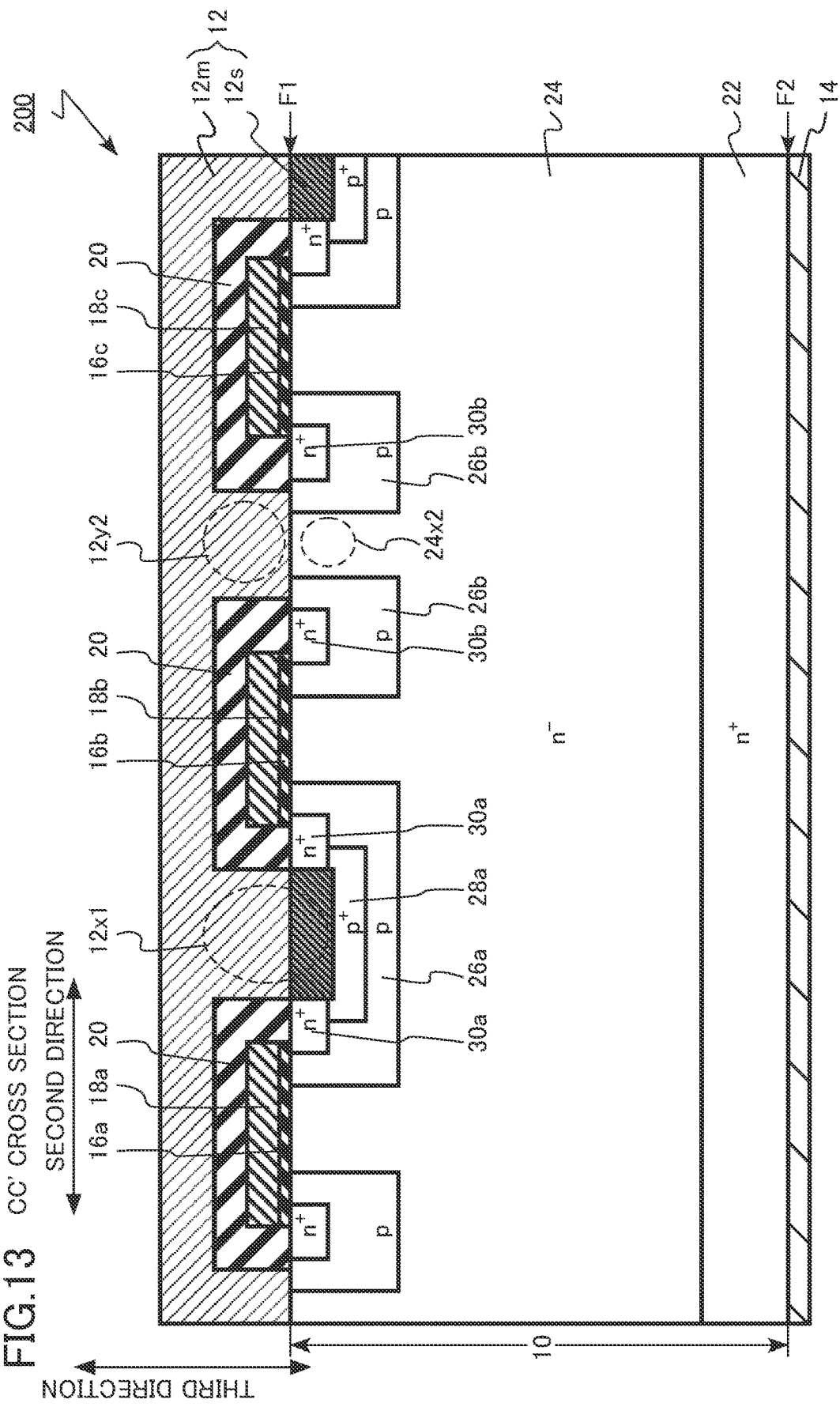
FIG. 13 is an enlarged schematic cross-sectional view of the semiconductor device of the second embodiment.
Figure 14:
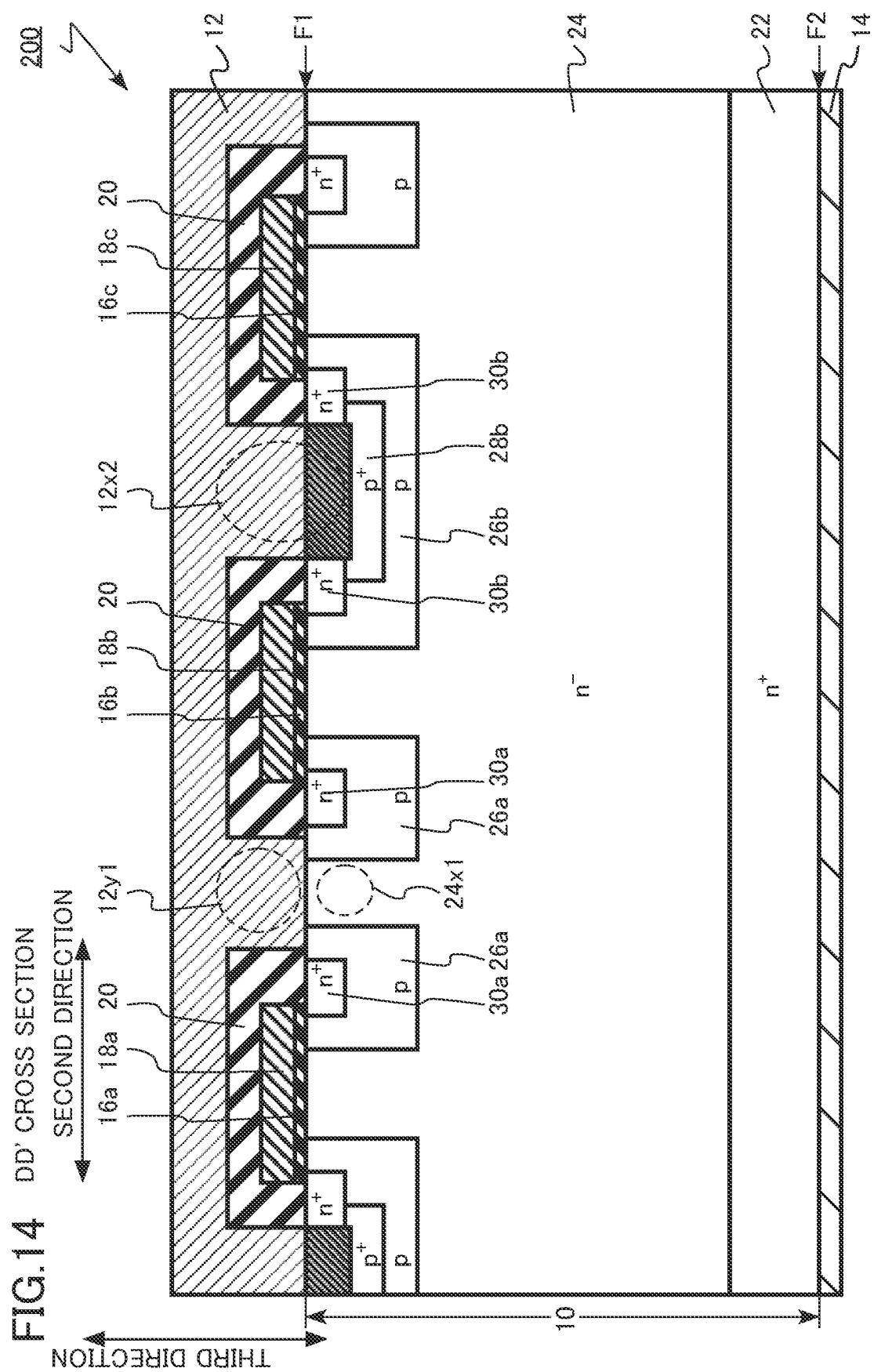
FIG. 14 is an enlarged schematic cross-sectional view of the semiconductor device of the second embodiment.
Figure 15:
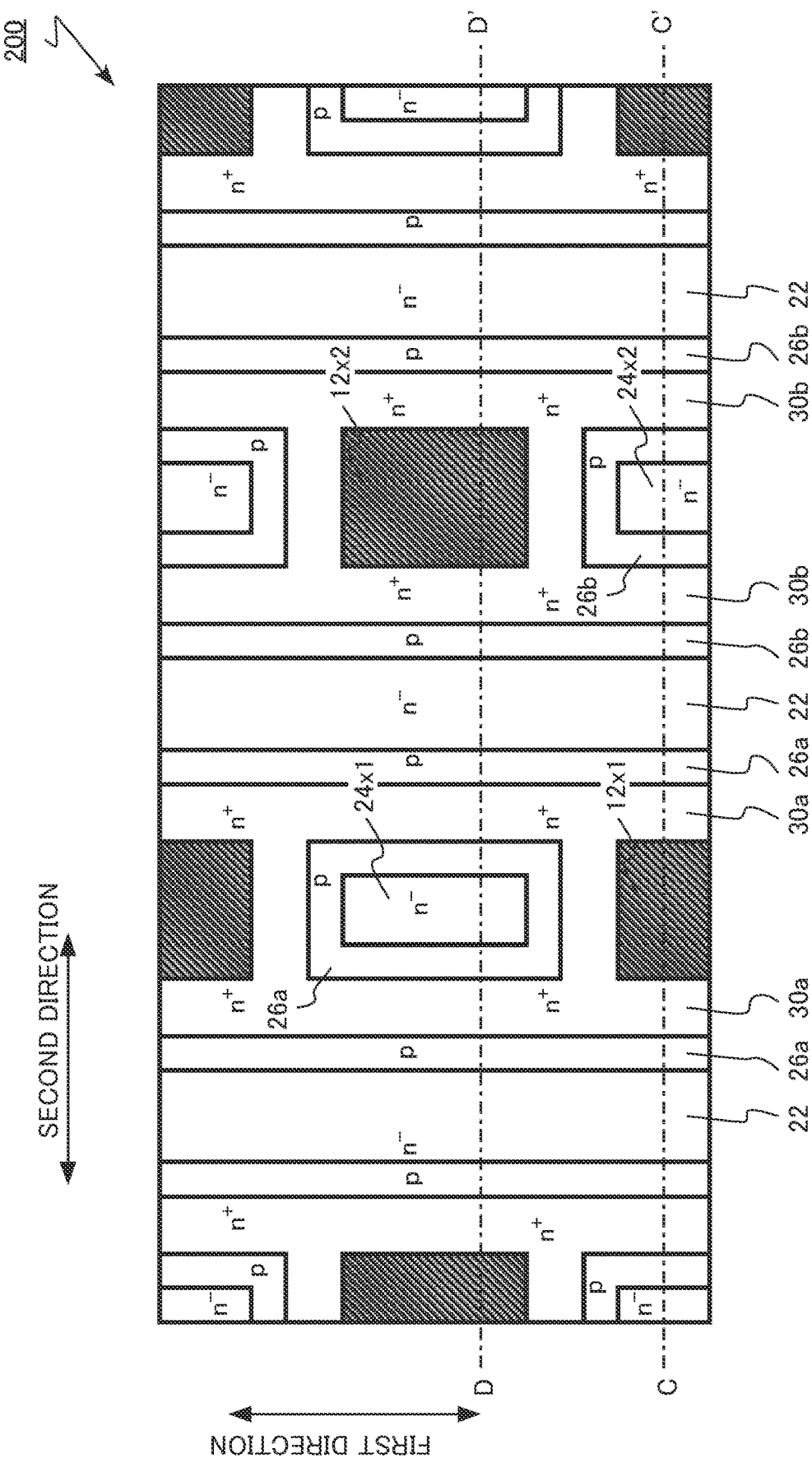
FIG. 15 is an enlarged schematic top view of the semiconductor device of the second embodiment.

FIGS. 13 and 14 are enlarged schematic cross-sectional views of the semiconductor device of the second embodiment. FIG. 15 is an enlarged schematic top view of the semiconductor device of the second embodiment. FIG. 15 is a diagram showing a pattern of a semiconductor region on the surface of a silicon carbide layer. FIG. 13 is a cross-sectional view taken along the line CC' of FIG. 15. FIG. 14 is a cross-sectional view taken along the line DD' of FIG. 15.

The MOSFET 200 includes a silicon carbide layer 10, a source electrode 12 (first electrode), a drain electrode 14 (second electrode), a gate insulating layer 16, a gate electrode 18, and an interlayer insulating layer 20. The source electrode 12 includes a metal silicide layer 12s and a metal layer 12m. The source electrode 12 includes a contact electrode portion 12x and a diode electrode portion 12y. The contact electrode portion 12x includes a first contact electrode portion 12x1 (first portion) and a second contact electrode portion 12x2 (third portion). The diode electrode portion 12y includes a first diode electrode portion 12y1 (second portion) and a second diode electrode portion 12y2 (fourth portion). The gate insulating layer 16 includes a first gate insulating layer 16a, a second gate insulating layer 16b, and a third gate insulating layer 16c. The gate electrode 18 includes a first gate electrode 18a, a second gate electrode 18b, and a third gate electrode 18c.

The silicon carbide layer 10 includes an $n^+$-type drain region 22, an $n^-$-type drift region 24 (first silicon carbide region), a p-type body region 26, a $p^+$-type body contact region 28, and an $n^+$-type source region 30. The p-type body region 26 includes a first body region of p-type 26a (second silicon carbide region) and a second body region of p-type 26b (fifth silicon carbide region). The $p^+$-type body contact region 28 includes a first body contact region of $p^+$-type 28a (third silicon carbide region) and a second body contact region of $p^+$-type 28b (sixth silicon carbide region). The $n^+$-type source region 30 includes a first source region of $n^+$-type 30a (fourth silicon carbide region) and a second source region of $n^+$-type 30b (seventh silicon carbide region).

The drift region 24 includes a JBS region 24x. The JBS region 24x includes a first JBS region 24x1 (first region) and a second JBS region 24x2 (second region).

The source electrode 12 is an example of the first electrode. The first contact electrode portion 12x1 is an example of the first portion. The second contact electrode portion 12x2 is an example of the third portion. The first diode electrode portion 12y1 is an example of the second portion. The second diode electrode portion 12y2 is an example of the fourth portion. The drain electrode 14 is an example of the second electrode. The drift region 24 is an example of the first silicon carbide region. The first JBS region 24x1 is an example of the first region. The second JBS region 24x2 is an example of the second region. The first body region 26a is an example of the second silicon carbide region. The first body contact region 28a is an example of the third silicon carbide region. The first source region 30a is an example of the fourth silicon carbide region. The second body region 26b is an example of the fifth silicon carbide region. The second body contact region 28b is an example of the sixth silicon carbide region. The second source region 30b is an example of the seventh silicon carbide region.

In the MOSFET 200, the contact electrode portion 12x is disposed in the second direction of the diode electrode portion 12y. For example, the second contact electrode portion 12x2 is disposed in the second direction of the first diode electrode portion 12y1.

In the MOSFET 200, the diode electrode portion 12y and the contact electrode portion 12x are adjacent to each other in the second direction. The arrangement of the contact electrode portion 12x and the diode electrode portion 12y in the first direction is an arrangement shifted by a half period with respect to the first-direction arrangement of the contact electrode portion 12x and the diode electrode portion 12y adjacent to each other in the second direction.

For example, in the MOSFET 100 of the first embodiment, another diode electrode portion 12y is disposed in the second direction of the diode electrode portion 12y. Therefore, a region where the transistor does not operate is continuous in the second direction.

In the MOSFET 200 of the second embodiment, since the diode electrode portion 12y and the contact electrode portion 12x are adjacent to each other in the second direction, a region where the transistor operates is provided in the second direction of the diode electrode portion 12y in which the transistor does not operate. Therefore, as compared with the MOSFET 100 of the first embodiment, a region where the on-current of the transistor flows is dispersed, so that the on-current of the MOSFET 200 increases.

First Modification Example

Figure 16:
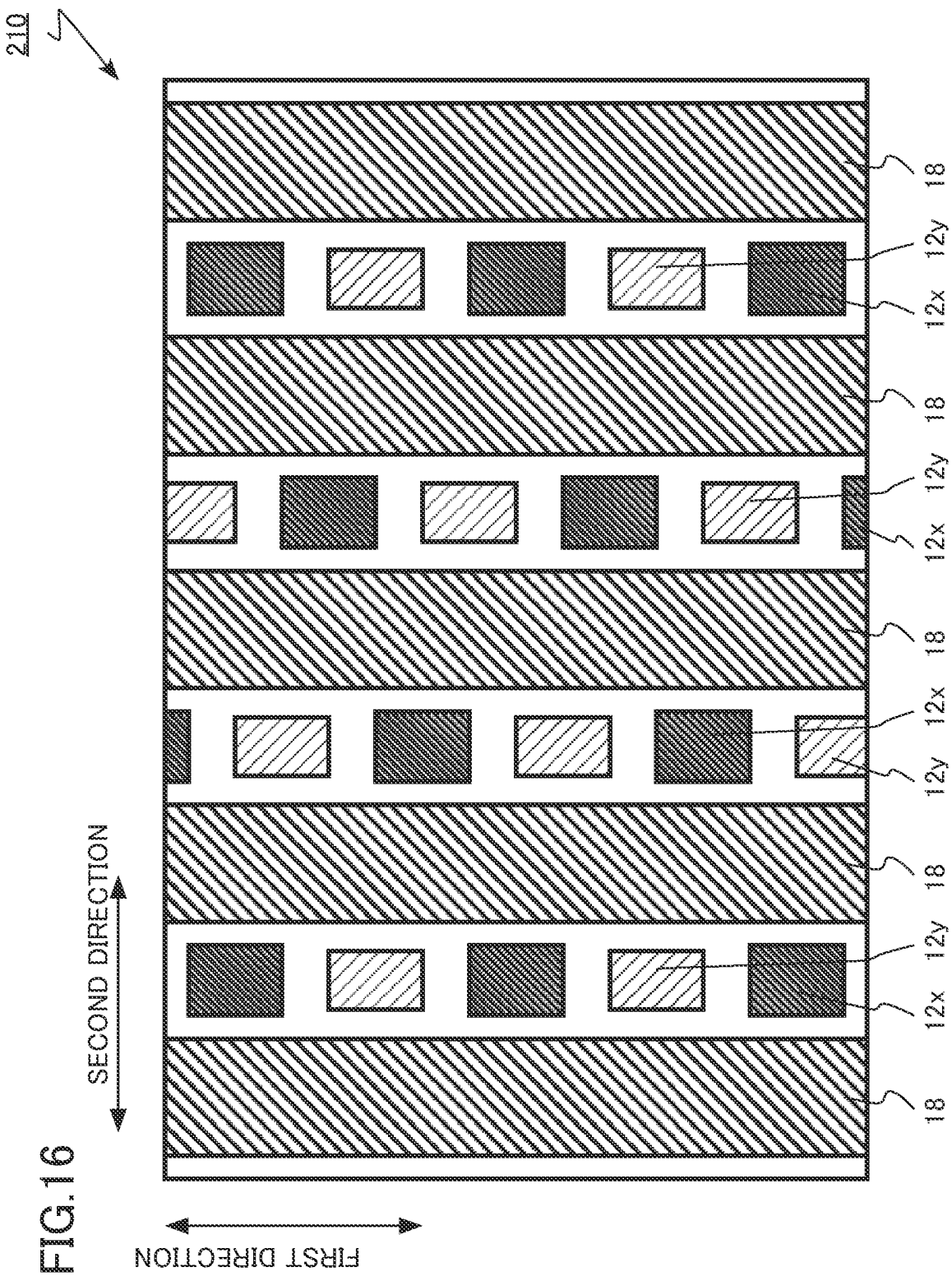
FIG. 16 is an enlarged schematic top view of a first modification example of the semiconductor device of the second embodiment.

FIG. 16 is an enlarged schematic top view of a first modification example of the semiconductor device of the second embodiment. FIG. 16 is a diagram showing a pattern of a semiconductor region on the surface of a silicon carbide layer. The first modification example of the semiconductor device of the second embodiment is a MOSFET 210.

In the MOSFET 210, as in the MOSFET 200, the diode electrode portion 12y and the contact electrode portion 12x are adjacent to each other in the second direction. In the MOSFET 210, the shift of the period of the arrangement of the contact electrode portion 12x and the diode electrode portion 12y in the first direction is different from that in the MOSFET 200. The on-current also increases in the MOSFET 210 of the first modification example of the semiconductor device of the second embodiment.

Second Modification Example

Figure 17:
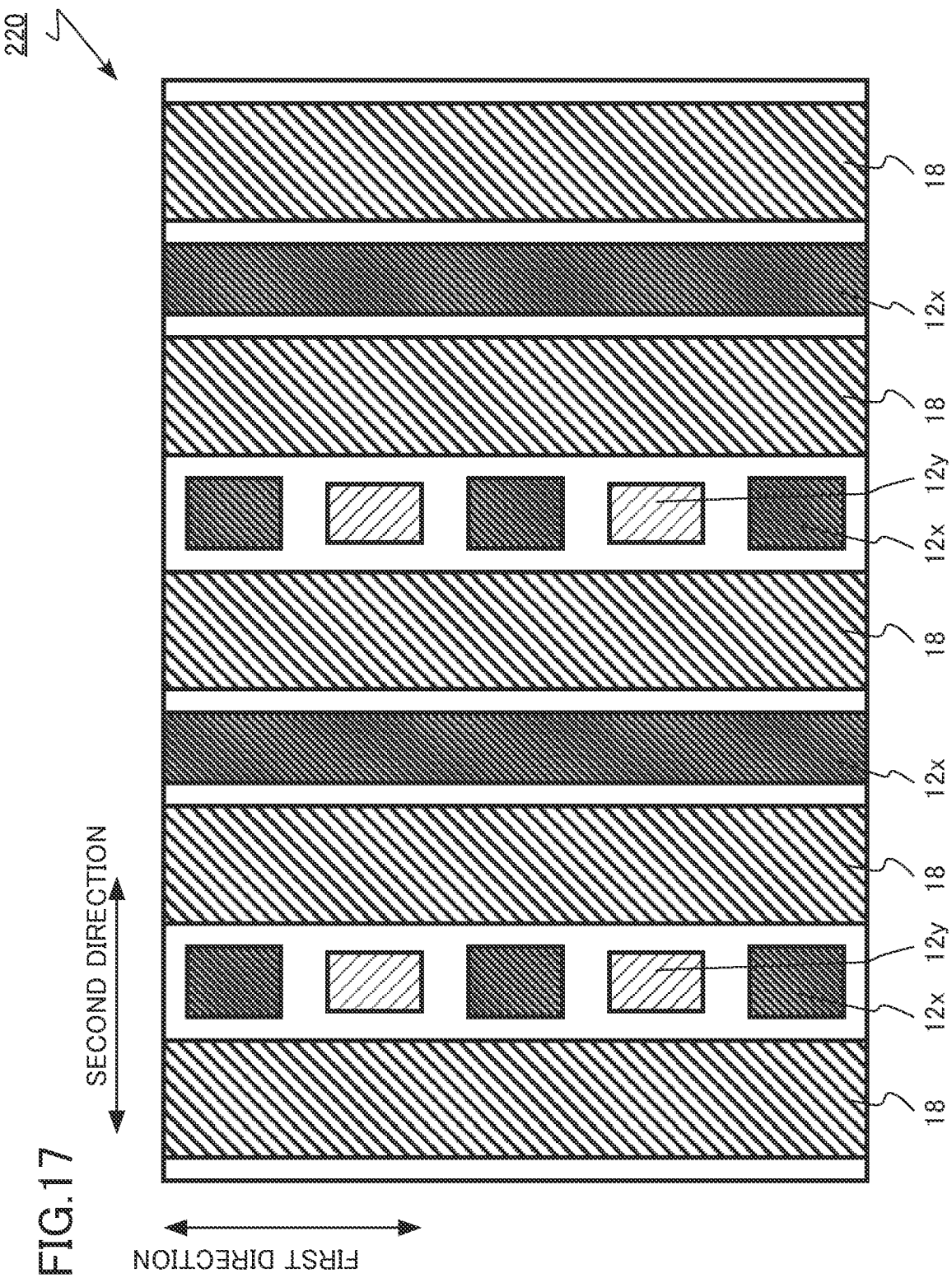
FIG. 17 is an enlarged schematic top view of a second modification example of the semiconductor device of the second embodiment.

FIG. 17 is an enlarged schematic top view of a second modification example of the semiconductor device of the second embodiment. FIG. 17 is a diagram showing a pattern of a semiconductor region on the surface of a silicon carbide layer. The second modification example of the semiconductor device of the second embodiment is a MOSFET 220.

In the MOSFET 220, as in the MOSFET 200, the diode electrode portion 12y and the contact electrode portion 12x are adjacent to each other in the second direction. The MOSFET 220 is different from the MOSFET 200 in that there is a gate electrode space in which the diode electrode portion 12y is not provided. The on-current also increases in the MOSFET 220 of the second modification example of the semiconductor device of the second embodiment.

As described above, according to the second embodiment and the modification examples, a MOSFET with improved reliability is realized. In addition, according to the second embodiment and the modification examples, a MOSFET in which the on-current increases is realized.

Third Embodiment

A semiconductor device of a third embodiment includes: a silicon carbide layer having a first face and a second face facing the first face and including: a first silicon carbide region of a first conductive type in contact with the first face; a second silicon carbide region of a second conductive type provided between the first silicon carbide region and the first face; a third silicon carbide region of a second conductive type provided between the second silicon carbide region and the first face and having a second conductive type impurity concentration higher than that in the second silicon carbide region; a fourth silicon carbide region of a first conductive type provided between the second silicon carbide region and the first face and in contact with the first face; a fifth silicon carbide region of a second conductive type provided between the first silicon carbide region and the first face and spaced from the second silicon carbide region in a second direction parallel to the first face and perpendicular to a first direction; a sixth silicon carbide region of a second conductive type provided between the fifth silicon carbide region and the first face and having a second conductive type impurity concentration higher than that in the fifth silicon carbide region; and a seventh silicon carbide region of a first conductive type provided between the fifth silicon carbide region and the first face and in contact with the first face; a first gate electrode provided on a side of the first face of the silicon carbide layer, extending in a first direction parallel to the first face, and facing the second silicon carbide region on the first face; a second gate electrode provided on the side of the first face of the silicon carbide layer, extending in the first direction, provided in a second direction with respect to the first gate electrode, and facing the second silicon carbide region on the first face; a third gate electrode provided on the side of the first face of the silicon carbide layer, extending in the first direction, provided in the second direction with respect to the second gate electrode, and facing the fifth silicon carbide region on the first face, the second gate electrode being provided between the first gate electrode and the third gate electrode; a first gate insulating layer provided between the second silicon carbide region and the first gate electrode; a second gate insulating layer provided between the second silicon carbide region and the second gate electrode and between the fifth silicon carbide region and the second gate electrode; a third gate insulating layer provided between the fifth silicon carbide region and the third gate electrode; a first electrode provided on the side of the first face of the silicon carbide layer and including: a first portion provided between the first gate electrode and the second gate electrode and in contact with the third silicon carbide region and the fourth silicon carbide region; at least one second portion provided between the first gate electrode and the second gate electrode, provided in the first direction of the first portion, and in contact with the first silicon carbide region on the first face; a third portion provided between the second gate electrode and the third gate electrode and in contact with the sixth silicon carbide region and the seventh silicon carbide region; and at least one fourth portion provided between the second gate electrode and the third gate electrode, provided in the first direction of the third portion, and in contact with the first silicon carbide region on the first face; a second electrode provided on a side of the second face of the silicon carbide layer; and a conductive layer provided in the first direction of the first gate electrode, extending in the second direction, connected to the first gate electrode, the second gate electrode, and the third gate electrode, and formed of the same material as the first gate electrode. The silicon carbide layer further includes an eighth silicon carbide region of a second conductive type provided between the first silicon carbide region and the conductive layer and electrically connected to the first electrode. The first electrode further includes a metal silicide layer. The first electrode does not include the metal silicide layer between the conductive layer and the at least one second portion closest to the conductive layer. The first electrode does not include the metal silicide layer between the conductive layer and the at least one fourth portion closest to the conductive layer. The semiconductor device of the third embodiment is different from the semiconductor devices of the first and second embodiments in that the structure of the first electrode in the boundary region between the element region and the termination region is defined. Hereinafter, the description of a part of the content overlapping the first and second embodiments may be omitted.

The semiconductor device of the third embodiment is a planar gate type vertical MOSFET 300 using silicon carbide. The MOSFET 300 of the third embodiment is a DIMOS-FET. In addition, the MOSFET 300 of the third embodiment includes an SBD as a built-in diode.

Figure 18:
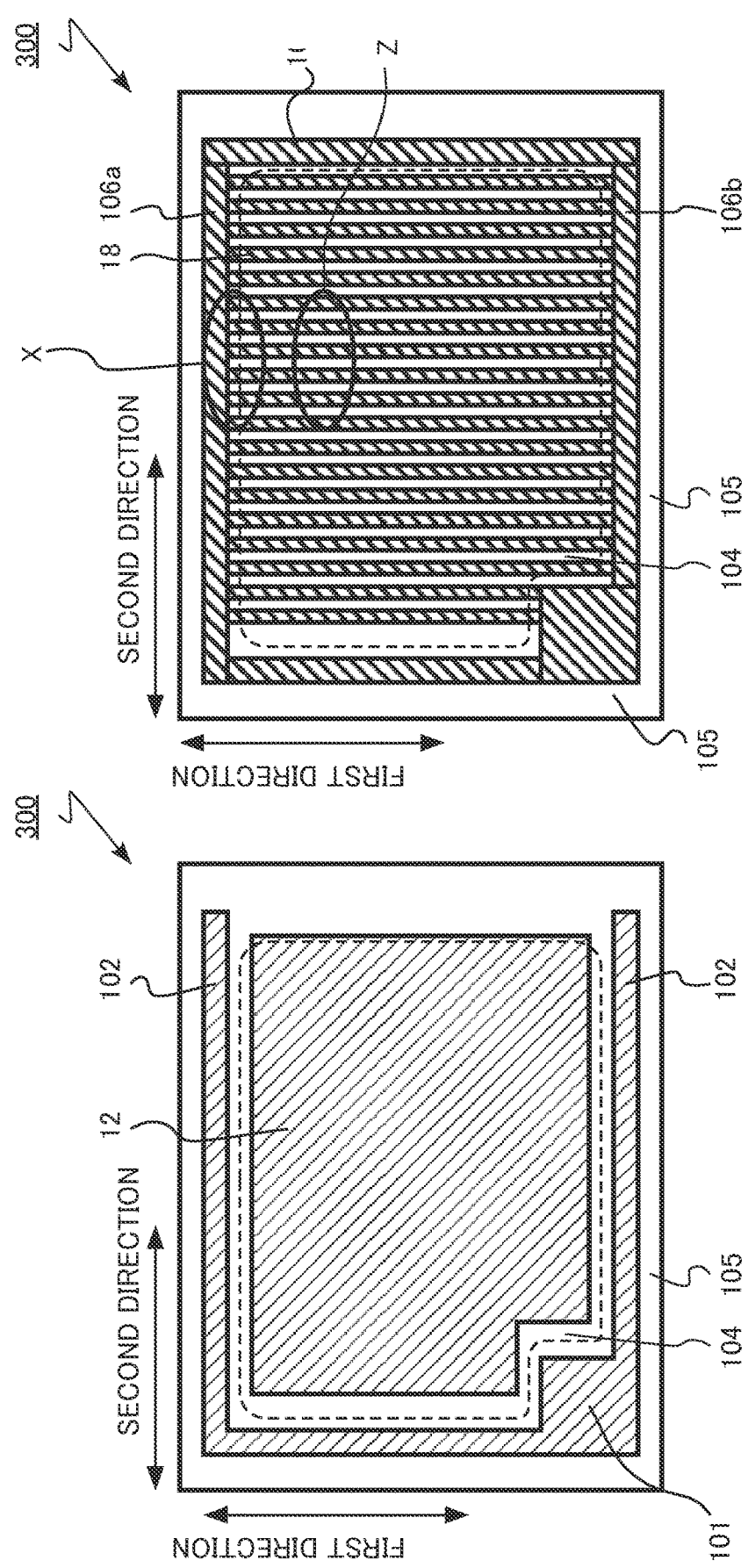
FIGS. 18A and 18B are diagrams showing the chip layout of a semiconductor device of a third embodiment.

FIGS. 18A and 18B are diagrams showing the chip layout of the semiconductor device of the third embodiment.

FIG. 18A is a top view of a chip of the MOSFET 300. The MOSFET 300 includes a source electrode 12, a gate electrode pad 101, and a gate electrode wiring 102. The gate electrode wiring 102 is connected to the gate electrode pad 101.

The source electrode 12, the gate electrode pad 101, and the gate electrode wiring 102 are, for example, metal. The source electrode 12, the gate electrode pad 101, and the gate electrode wiring 102 are formed of the same material.

The MOSFET 300 includes an element region 104 and a termination region 105. A transistor is provided in the element region 104. The termination region 105 surrounds the element region 104. A structure for increasing the breakdown voltage of the MOSFET 300 is provided in the termination region 105. The structure for increasing the breakdown voltage of the MOSFET 300 is, for example, a resurf or a guard ring.

FIG. 18B is a diagram showing a pattern of the gate electrode 18 of the MOSFET 300. FIG. 18B shows a pattern of the gate electrode 18 provided below the source electrode 12.

The MOSFET 300 includes a plurality of gate electrodes 18, a first gate electrode connection line 106a (conductive layer), a second gate electrode connection line 106b, and an end gate electrode connection line 107. The first gate electrode connection line 106a is an example of the conductive layer.

The gate electrode 18 is provided in the element region 104. The gate electrode 18 extends in the first direction.

The first gate electrode connection line 106a, the second gate electrode connection line 106b, and the end gate electrode connection line 107 are provided in the termination region 105. The first gate electrode connection line 106a and the second gate electrode connection line 106b extend in the second direction perpendicular to the first direction. The first gate electrode connection line 106a and the second gate electrode connection line 106b are connected to the gate electrode 18 in the first direction. The first gate electrode connection line 106a and the second gate electrode connection line 106b are electrically connected to the gate electrode wiring 102.

The end gate electrode connection line 107 is connected to, for example, the first gate electrode connection line 106a and the second gate electrode connection line 106b in the first direction.

The gate electrode 18, the first gate electrode connection line 106a, the second gate electrode connection line 106b, and the end gate electrode connection line 107 are formed of the same material.

The gate voltage applied to the gate electrode pad 101 is applied to the gate electrode 18.

Figure 19:
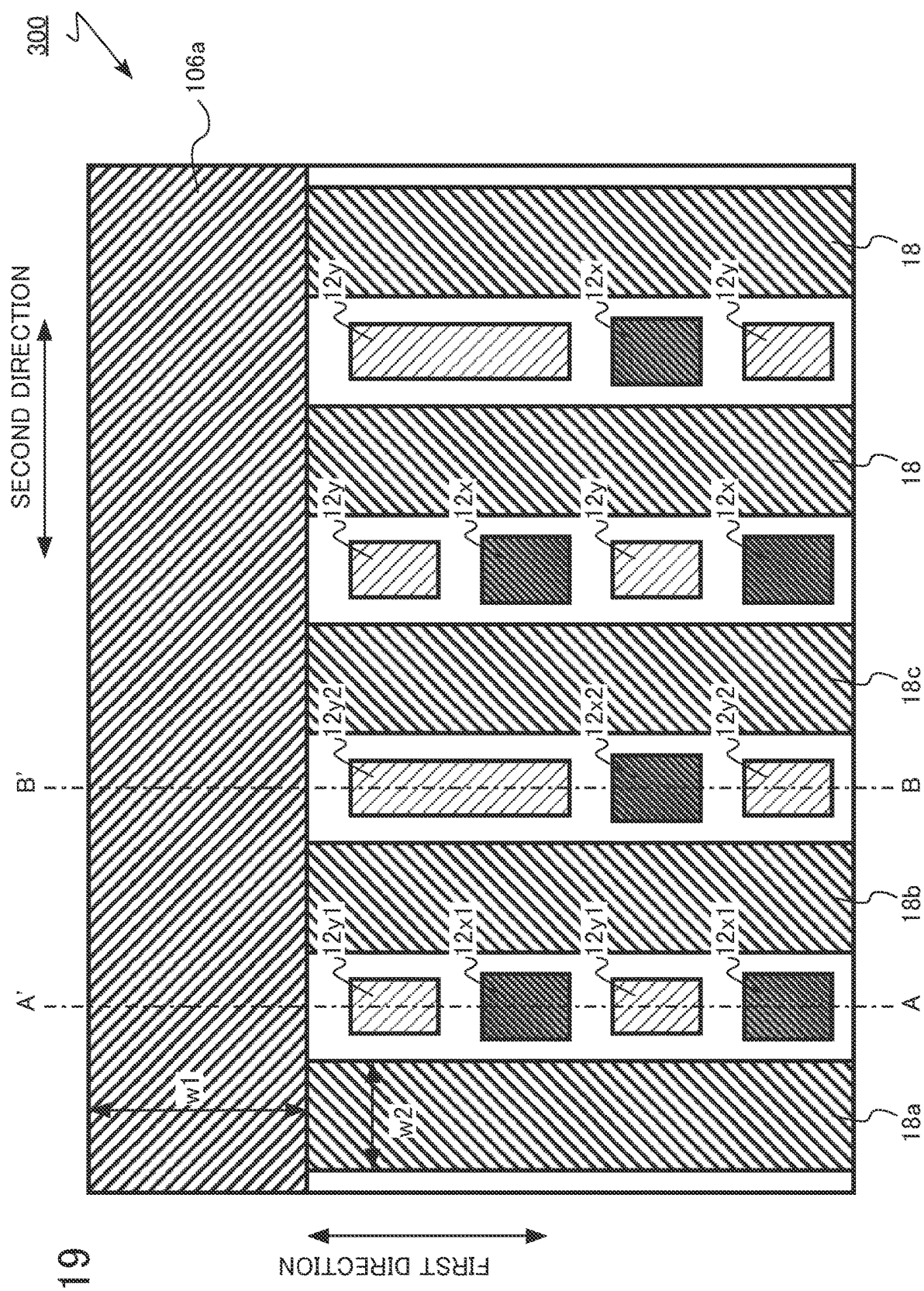
FIG. 19 is a schematic top view of the semiconductor device of the third embodiment.
Figure 20:
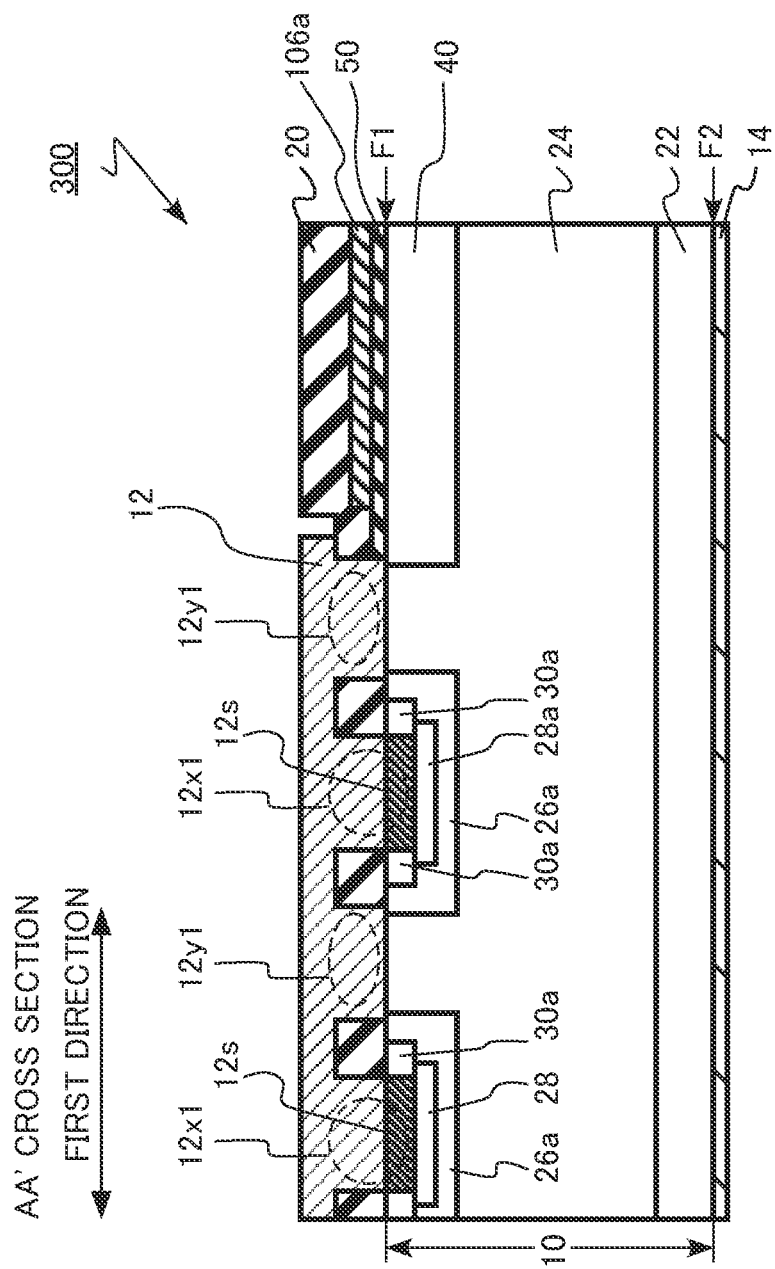
FIG. 20 is a schematic cross-sectional view of the semiconductor device of the third embodiment.
Figure 21:
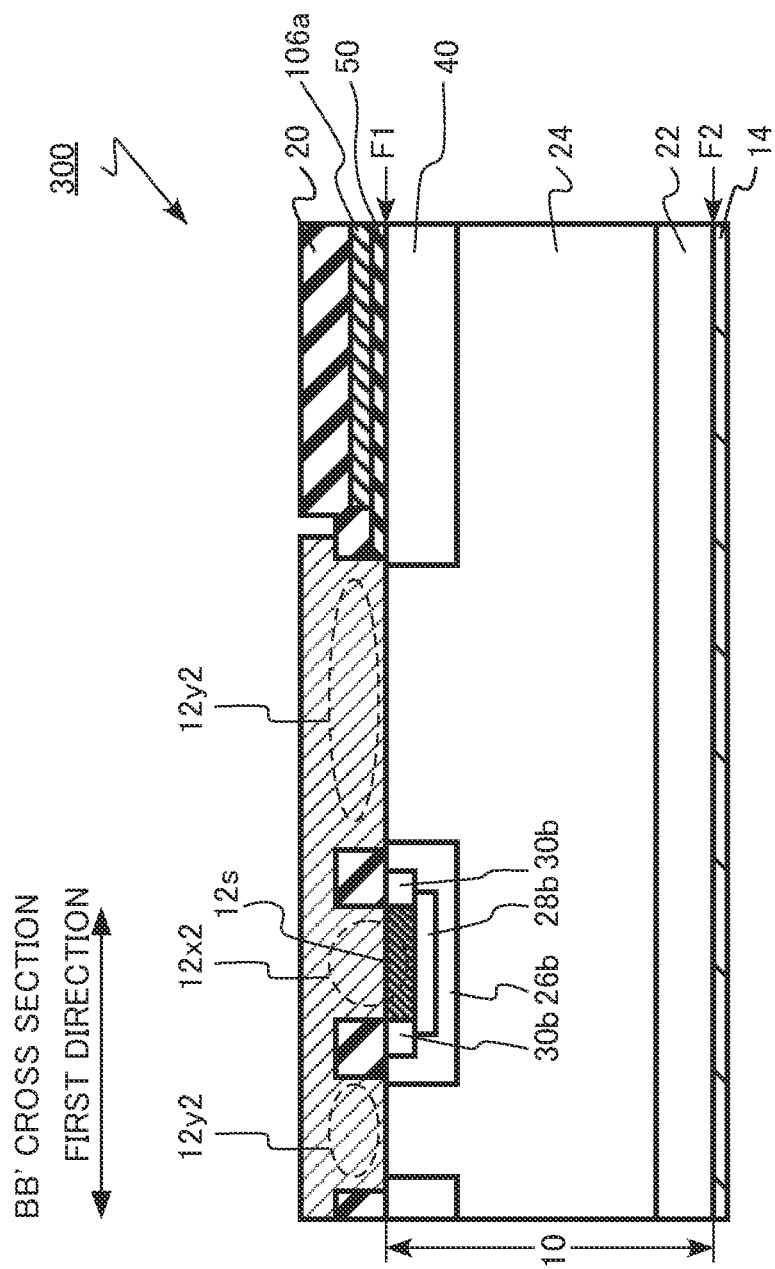
FIG. 21 is a schematic cross-sectional view of the semiconductor device of the third embodiment.

FIG. 19 is a schematic top view of the semiconductor device of the third embodiment. FIG. 19 is a schematic diagram showing a pattern of a gate electrode and a source electrode on the top surface of a silicon carbide layer. FIGS. 20 and 21 are schematic cross-sectional views of the semiconductor device of the third embodiment. FIG. 20 is a cross-sectional view taken along the line AA' of FIG. 19. FIG. 21 is a cross-sectional view taken along the line BB' of FIG. 19.

FIGS. 19, 20, and 21 are diagrams showing the structure of a boundary region between the element region 104 and the termination region 105 of the MOSFET 300. FIGS. 19, 20, and 21 are diagrams showing, for example, the structure of a region X in FIG. 18B.

In addition, the structure of the element region 104 of the MOSFET 300 is the same as, for example, that of the semiconductor device of the first embodiment or the second embodiment. For example, the structure of a region Z in FIG. 18B is the same as that in the semiconductor device of the first embodiment or the second embodiment.

The MOSFET 300 includes a substrate insulating layer 50. The substrate insulating layer 50 is provided in the termination region. The substrate insulating layer 50 is provided between the first gate electrode connection line 106a and the silicon carbide layer 10. The thickness of the substrate insulating layer 50 is, for example, larger than the thickness of the gate insulating layer 16.

The substrate insulating layer 50 contains, for example, silicon oxide. The substrate insulating layer 50 is, for example, a silicon oxide layer.

The gate electrode 18 includes a first gate electrode 18a, a second gate electrode 18b, and a third gate electrode 18c. The first gate electrode 18a, the second gate electrode 18b, and the third gate electrode 18c are connected to the first gate electrode connection line 106a.

The width (w1 in FIG. 19) of the first gate electrode connection line 106a in the first direction is larger than the width (w2 in FIG. 19) of the gate electrode 18 in the second direction.

The source electrode 12 includes a contact electrode portion 12x and a diode electrode portion 12y. The contact electrode portion 12x includes a first contact electrode portion 12x1 (first portion) and a second contact electrode portion 12x2 (third portion). The diode electrode portion 12y includes a first diode electrode portion 12y1 (second portion) and a second diode electrode portion 12y2 (fourth portion).

The source electrode 12 is an example of the first electrode. The first contact electrode portion 12x1 is an example of the first portion. The second contact electrode portion 12x2 is an example of the third portion. The first diode electrode portion 12y1 is an example of the second portion. The second diode electrode portion 12y2 is an example of the fourth portion.

The silicon carbide layer 10 includes a first resurf region of p-type 40 (eighth silicon carbide region). The first resurf region 40 is an example of the eighth silicon carbide region.

The first resurf region 40 is provided between the first gate electrode connection line 106a and the drift region 24. The first resurf region 40 is provided between the substrate insulating layer 50 and the drift region 24.

The first resurf region 40 has a function of reducing the strength of the electric field applied to the end of the element region 104 to increase the breakdown voltage of the MOSFET 300.

The first resurf region 40 contains, for example, aluminum (Al) as a p-type impurity. The p-type impurity concentration in the first resurf region 40 is equal to or more than $5 \times 10^{16}$ cm$^{-3}$ and equal to or less than $5 \times 10^{19}$ cm$^{-3}$, for example.

The depth of the first resurf region 40 is equal to or more than 500 nm and equal to or less than 900 nm, for example.

The first resurf region 40 is electrically connected to the source electrode 12. The first resurf region 40 is fixed to the electric potential of the source electrode 12.

A part of the first resurf region 40 is in contact with the first face F1. A part of the first resurf region 40 faces the first gate electrode connection line 106a.

In the MOSFET 300, of the contact electrode portion 12x and the diode electrode portion 12y interposed between the two gate electrodes 18, the diode electrode portion 12y is closest to the first gate electrode connection line 106a. In other words, the contact electrode portion 12x is not provided between the first gate electrode connection line 106a and the diode electrode portion 12y closest to the first gate electrode connection line 106a among the diode electrode portions 12y interposed between the two gate electrodes 18. In other words, the source electrode 12 does not include the metal silicide layer 12s between the first gate electrode connection line 106a and the diode electrode portion 12y closest to the first gate electrode connection line 106a.

For example, of the first contact electrode portion 12x1 and the first diode electrode portion 12y1 provided between the first gate electrode 18a and the second gate electrode 18b, the first diode electrode portion 12y1 is closest to the first gate electrode connection line 106a. The first contact electrode portion 12x1 is not provided between the first gate electrode connection line 106a and the first diode electrode portion 12y1 closest to the first gate electrode connection line 106a among the first diode electrode portions 12y1 interposed between the first gate electrode 18a and the second gate electrode 18b. The source electrode 12 does not include the metal silicide layer 12s between the first gate electrode connection line 106a and the first diode electrode portion 12y1 closest to the first gate electrode connection line 106a.

In addition, for example, of the second contact electrode portion 12x2 and the second diode electrode portion 12y2 provided between the second gate electrode 18b and the third gate electrode 18c, the second diode electrode portion 12y2 is closest to the first gate electrode connection line 106a. The second contact electrode portion 12x2 is not provided between the first gate electrode connection line 106a and the second diode electrode portion 12y2 closest to the first gate electrode connection line 106a among the second diode electrode portions 12y2 interposed between the second gate electrode 18b and the third gate electrode 18c. The source electrode 12 does not include the metal silicide layer 12s between the first gate electrode connection line 106a and the second diode electrode portion 12y2 closest to the first gate electrode connection line 106a.

Next, the function and effect of the semiconductor device of the third embodiment will be described.

Figure 22:
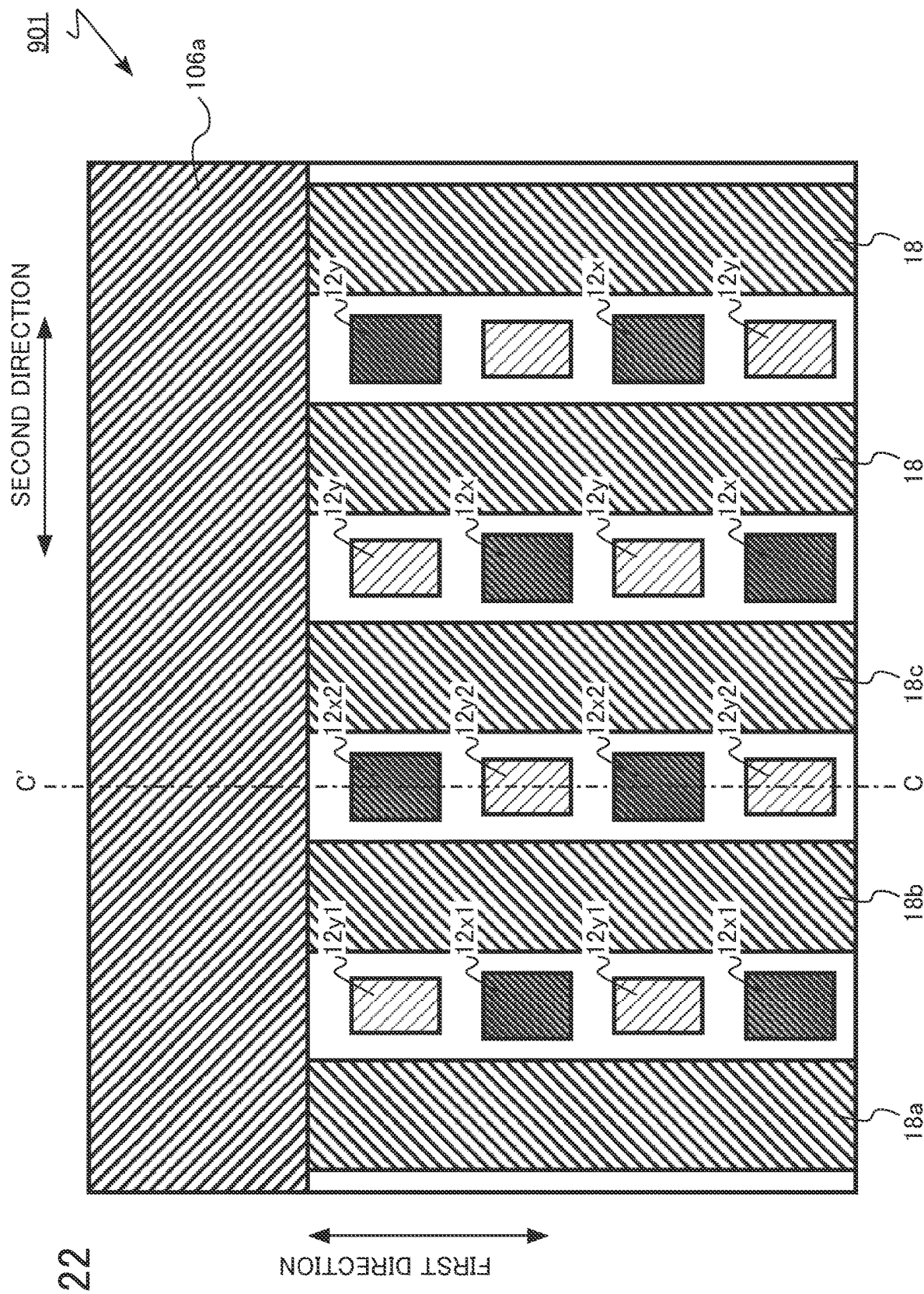
FIG. 22 is a schematic top view of a semiconductor device of a comparative example of the third embodiment.
Figure 23:
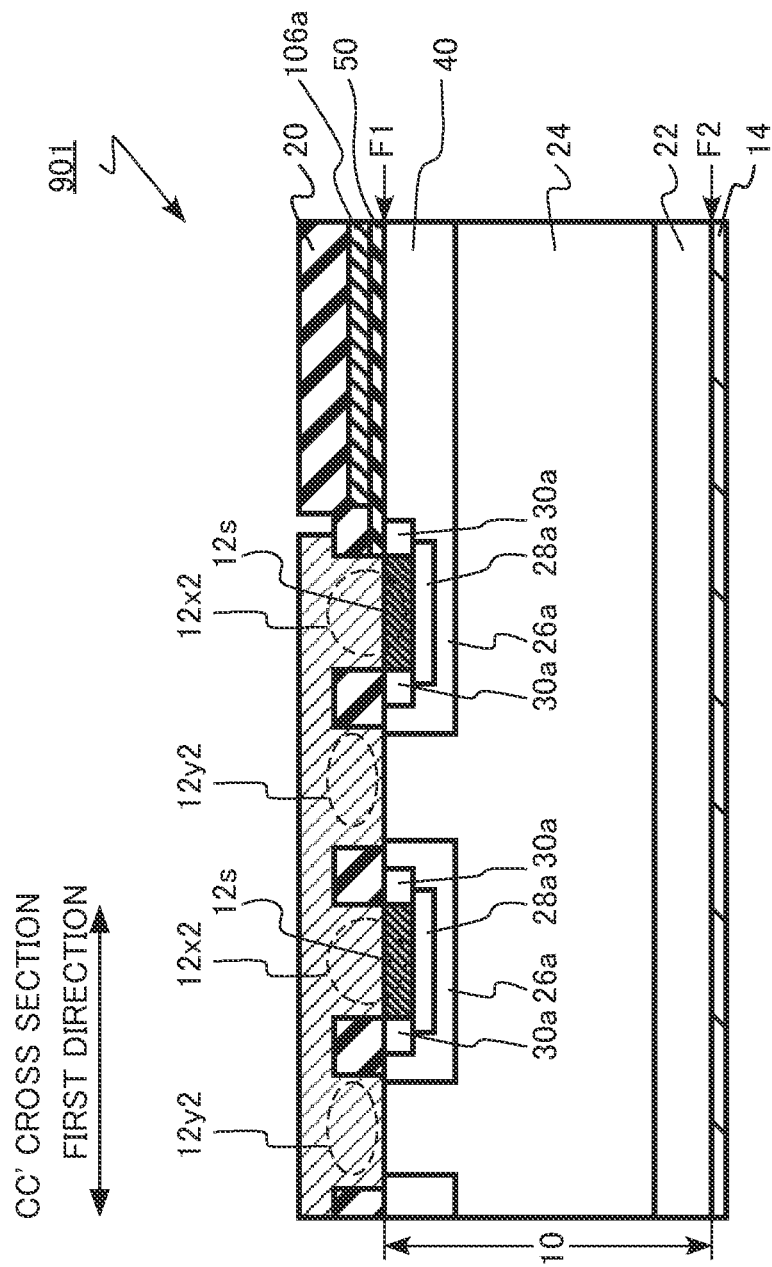
FIG. 23 is a schematic cross-sectional view of a semiconductor device of a comparative example of the third embodiment.

FIG. 22 is a schematic top view of a semiconductor device of a comparative example of the third embodiment. FIG. 22 is a schematic diagram showing a pattern of a gate electrode and a source electrode on the top surface of a silicon carbide layer. FIG. 23 is a schematic cross-sectional view of a semiconductor device of a comparative example of the third embodiment. FIG. 23 is a cross-sectional view taken along the line CC' of FIG. 22. FIG. 22 is a diagram corresponding to FIG. 19 of the third embodiment. FIG. 23 is a diagram corresponding to FIG. 21 of the third embodiment.

The semiconductor device of the comparative example is a planar gate type vertical MOSFET 901 using silicon carbide.

The MOSFET 901 of the comparative example is different from the MOSFET 300 of the third embodiment in that, of the contact electrode portion 12x and the diode electrode portion 12y interposed between the two gate electrodes 18, the contact electrode portion 12x may be closest to the first gate electrode connection line 106a. In other words, the MOSFET 901 of the comparative example is different from the MOSFET 300 of the third embodiment in that the contact electrode portion 12x may be provided between the first gate electrode connection line 106a and the diode electrode portion 12y closest to the first gate electrode connection line 106a among the diode electrode portions 12y interposed between the two gate electrodes 18. In other words, the MOSFET 901 of the comparative example is different from the MOSFET 300 of the third embodiment in that the source electrode 12 may include the metal silicide layer 12*s* between the first gate electrode connection line 106*a* and the diode electrode portion 12*y* closest to the first gate electrode connection line 106*a*.

For example, of the second contact electrode portion 12*x*2 and the second diode electrode portion 12*y*2 provided between the second gate electrode 18*b* and the third gate electrode 18*c*, the second contact electrode portion 12*x*2 is closest to the first gate electrode connection line 106*a*. The second contact electrode portion 12*x*2 is provided between the first gate electrode connection line 106*a* and the second diode electrode portion 12*y*2 closest to the first gate electrode connection line 106*a* among the second diode electrode portions 12*y*2 interposed between the second gate electrode 18*b* and the third gate electrode 18*c*. The source electrode 12 includes the metal silicide layer 12*s* between the first gate electrode connection line 106*a* and the second diode electrode portion 12*y*2 closest to the first gate electrode connection line 106*a*.

In the MOSFET having a built-in SBD, when the SBD is forward-biased, the current flowing through the SBD flows through the bottom of the first resurf region 40, so that the increase in the voltage applied to the pn junction between the first resurf region 40 and the drift region 24 is suppressed. By suppressing the increase in the voltage applied to the pn junction, the pn junction diode is suppressed from being turned on. By suppressing the pn junction diode from being turned on, the injection of holes from the body region 26 into the drift region 24 is suppressed. In the MOSFET having a built-in SBD, by suppressing the holes injected into the drift region 24, the growth of a stacking fault in the silicon carbide layer is suppressed, and accordingly, a reduction in reliability is suppressed.

When the distance from the SBD to the first resurf region 40 increases, the increase in the voltage applied to the pn junction cannot be sufficiently suppressed, so that the pn junction diode is easily turned on. Therefore, the reliability may be reduced.

In the MOSFET 901 of the comparative example, the contact electrode portion 12*x* is provided between the diode electrode portion 12*y* and the first gate electrode connection line 106*a*. Therefore, the distance from the SBD to the first resurf region 40 increases. Alternatively, the area of the SBD near the first resurf region 40 decreases. Therefore, there is a concern that the pn junction diode will be turned on to reduce the reliability of the MOSFET 901.

In the MOSFET 300 of the third embodiment, the contact electrode portion 12*x* is not provided between the diode electrode portion 12*y* and the first gate electrode connection line 106*a*. Therefore, the distance from the SBD to the first resurf region 40 is smaller than that in the MOSFET 901 of the comparative example. Alternatively, the area of the SBD near the first resurf region 40 increases. Therefore, the pn junction diode is suppressed from being turned on. As a result, the reliability of the MOSFET 300 is improved.

As described above, according to the third embodiment, a MOSFET with improved reliability is realized.

Fourth Embodiment

A semiconductor device of a fourth embodiment includes: a silicon carbide layer having a first face and a second face facing the first face and including: a first silicon carbide region of a first conductive type in contact with the first face; a second silicon carbide region of a second conductive type provided between the first silicon carbide region and the first face; a third silicon carbide region of a second conductive type provided between the second silicon carbide region and the first face and having a second conductive type impurity concentration higher than that in the second silicon carbide region; and a fourth silicon carbide region of a first conductive type provided between the second silicon carbide region and the first face and in contact with the first face; a first gate electrode provided on a side of the first face of the silicon carbide layer, extending in a first direction parallel to the first face, and facing the second silicon carbide region on the first face; a second gate electrode provided on the side of the first face of the silicon carbide layer, extending in the first direction parallel to the first face, provided in a second direction parallel to the first face and perpendicular to the first direction with respect to the first gate electrode, and facing the second silicon carbide region on the first face; a first gate insulating layer provided between the second silicon carbide region and the first gate electrode; a second gate insulating layer provided between the second silicon carbide region and the second gate electrode; a first electrode provided on the side of the first face of the silicon carbide layer and including: a first portion provided between the first gate electrode and the second gate electrode and in contact with the third silicon carbide region and the fourth silicon carbide region; and a second portion provided between the first gate electrode and the second gate electrode, provided in the first direction of the first portion, and in contact with the first silicon carbide region on the first face; a second electrode provided on a side of the second face of the silicon carbide layer; and a conductive layer provided in the second direction of the second gate electrode, extending in the first direction, having a width in the second direction larger than a width of the second gate electrode in the second direction, and formed of the same material as the second gate electrode. The silicon carbide layer further includes a fifth silicon carbide region of a second conductive type provided between the first silicon carbide region and the conductive layer and electrically connected to the first electrode. The first electrode further includes a metal silicide layer. The first electrode further includes a third portion provided between the second gate electrode and the conductive layer and in contact with the silicon carbide layer. The third portion does not include the metal silicide layer. The semiconductor device of the fourth embodiment is different from the semiconductor devices of the first and second embodiments in that the structure of the first electrode in the boundary region between the element region and the termination region is defined. In addition, the semiconductor device of the fourth embodiment is different from the semiconductor device of the third embodiment in that the first structure of the boundary region at a position different from that in the third embodiment is defined. Hereinafter, the description of a part of the content overlapping the first to third embodiments may be omitted.

The semiconductor device of the fourth embodiment is a planar gate type vertical MOSFET 400 using silicon carbide. The MOSFET 400 of the fourth embodiment is a DIMOSFET. In addition, the MOSFET 400 of the fourth embodiment includes an SBD as a built-in diode.

Figure 24:
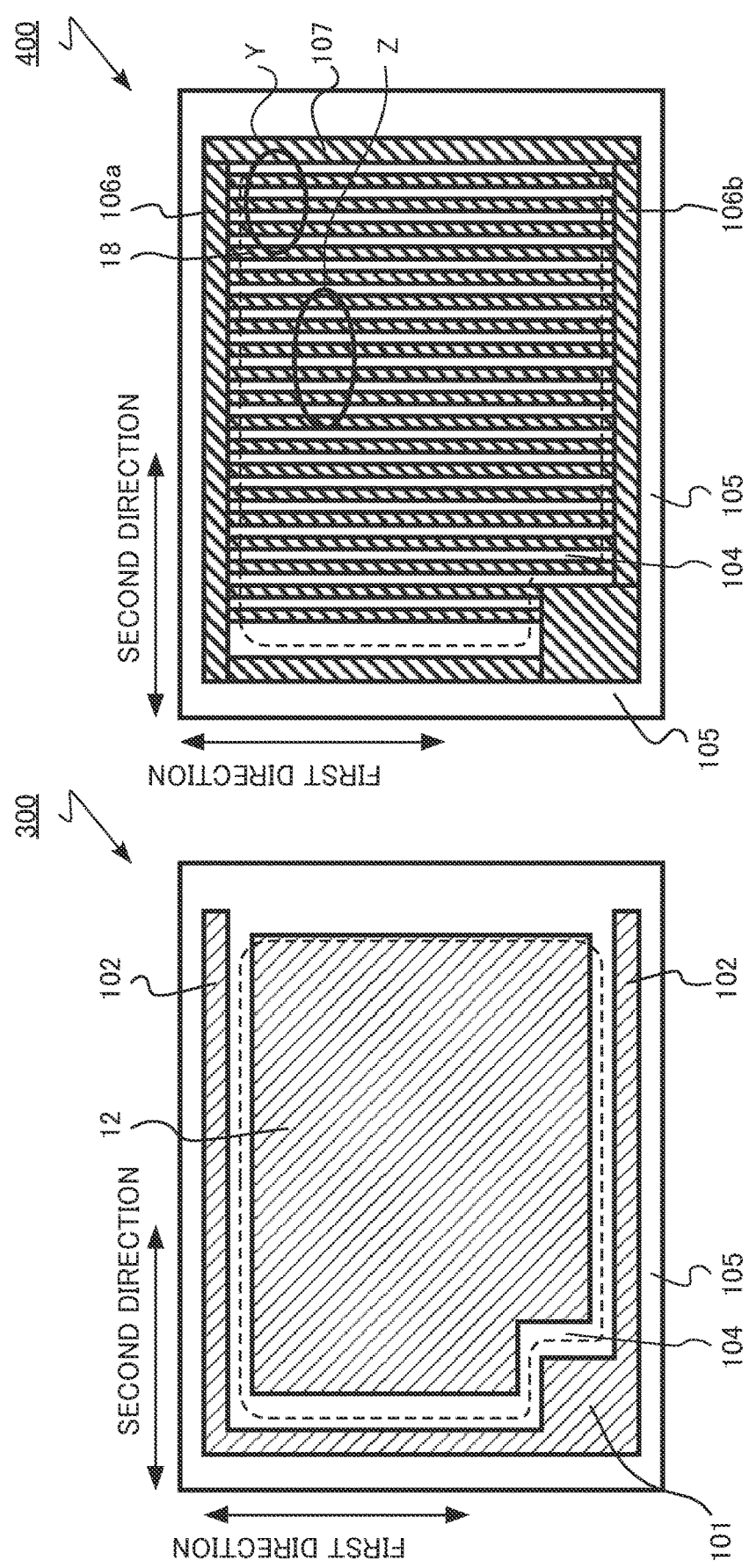
FIGS. 24A and 24B are diagrams showing the chip layout of a semiconductor device of a fourth embodiment.

FIGS. 24A and 24B are diagrams showing the chip layout of the semiconductor device of the fourth embodiment. FIGS. 24A and 24B are diagrams corresponding to FIGS. 18A and 18B of the third embodiment.

FIG. 24A is a top view of a chip of the MOSFET 400. The MOSFET 400 includes a source electrode 12, a gate electrode pad 101, and a gate electrode wiring 102. The gate electrode wiring 102 is connected to the gate electrode pad 101.

The source electrode 12, the gate electrode pad 101, and the gate electrode wiring 102 are, for example, a metal layer. The source electrode 12, the gate electrode pad 101, and the gate electrode wiring 102 are formed of the same material.

The MOSFET 400 includes an element region 104 and a termination region 105. A transistor is provided in the element region 104. The termination region 105 surrounds the element region 104. A structure for increasing the breakdown voltage of the MOSFET 400 is provided in the termination region 105. The structure for increasing the breakdown voltage of the MOSFET 400 is, for example, a resurf or a guard ring.

FIG. 24B is a diagram showing a pattern of the gate electrode 18 of the MOSFET 400. FIG. 24B shows a pattern of the gate electrode 18 provided below the source electrode 12.

The MOSFET 400 includes a plurality of gate electrodes 18, a first gate electrode connection line 106a, a second gate electrode connection line 106b, and an end gate electrode connection line 107 (conductive layer). The end gate electrode connection line 107 is an example of the conductive layer.

The gate electrode 18 is provided in the element region 104. The gate electrode 18 extends in the first direction.

The first gate electrode connection line 106a, the second gate electrode connection line 106b, and the end gate electrode connection line 107 are provided in the termination region 105. The first gate electrode connection line 106a and the second gate electrode connection line 106b extend in the second direction perpendicular to the first direction. The first gate electrode connection line 106a and the second gate electrode connection line 106b are connected to the gate electrode 18 in the first direction. The first gate electrode connection line 106a and the second gate electrode connection line 106b are electrically connected to the gate electrode wiring 102.

The end gate electrode connection line 107 is connected to, for example, the first gate electrode connection line 106a and the second gate electrode connection line 106b in the first direction.

The gate electrode 18, the first gate electrode connection line 106a, the second gate electrode connection line 106b, and the end gate electrode connection line 107 are formed of the same material.

The gate voltage applied to the gate electrode pad 101 is applied to the gate electrode 18.

Figure 25:
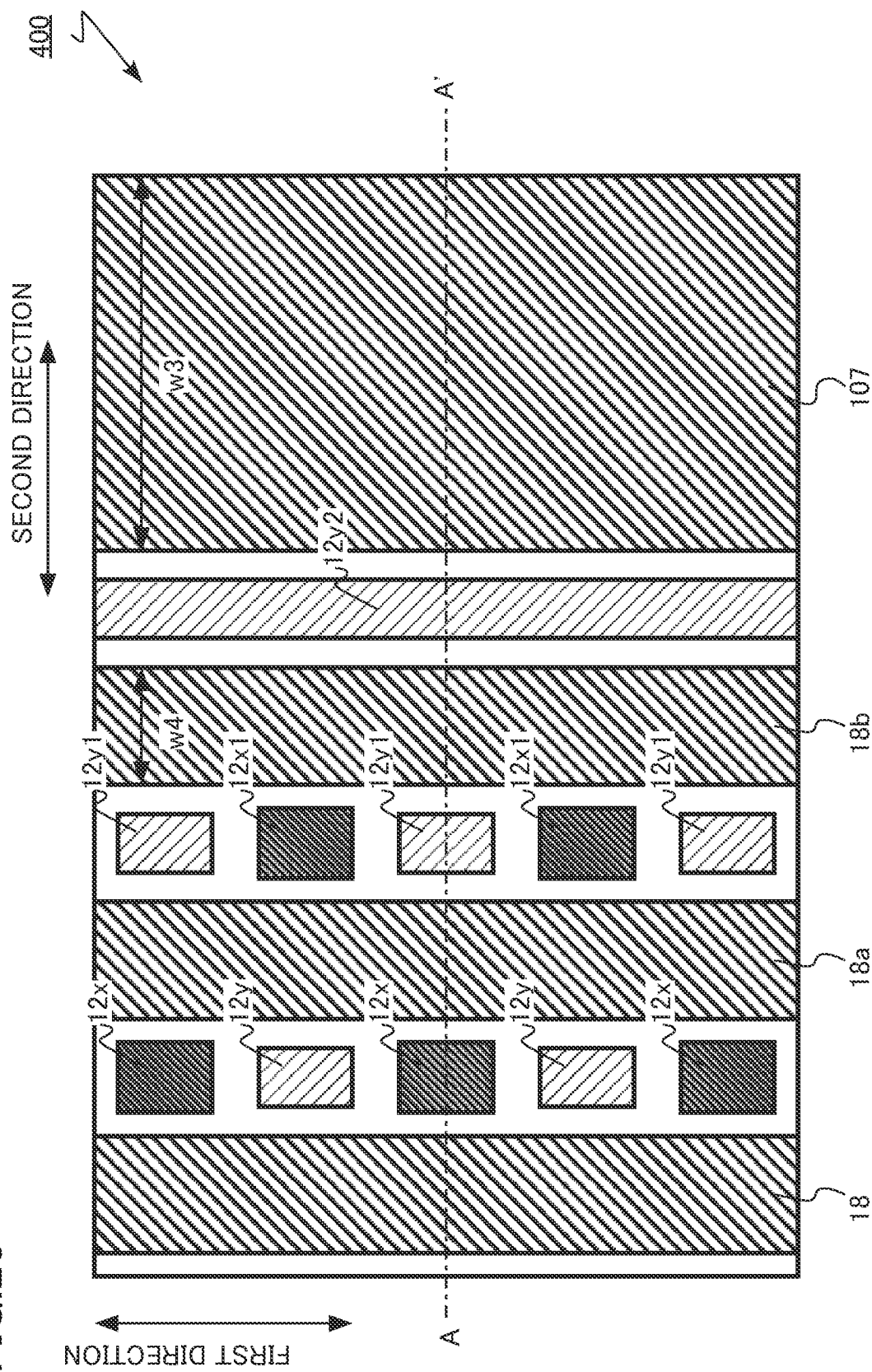
FIG. 25 is a schematic top view of the semiconductor device of the fourth embodiment.
Figure 26:
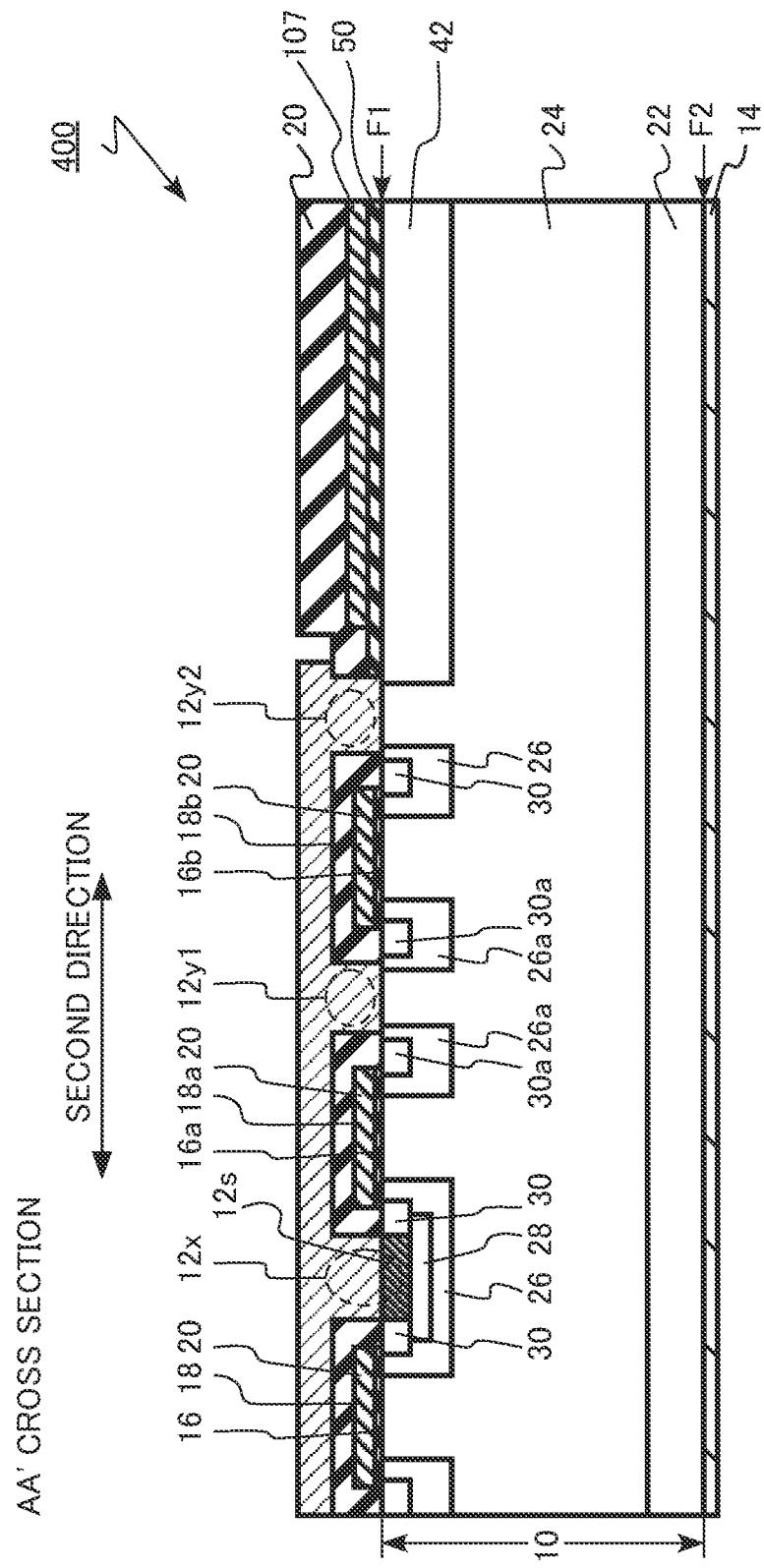
FIG. 26 is a schematic cross-sectional view of the semiconductor device of the fourth embodiment.

FIG. 25 is a schematic top view of the semiconductor device of the fourth embodiment. FIG. 25 is a schematic diagram showing a pattern of a gate electrode and a source electrode on the top surface of a silicon carbide layer. FIG. 26 is a schematic cross-sectional view of the semiconductor device of the fourth embodiment. FIG. 26 is a cross-sectional view taken along the line AA' of FIG. 25.

FIGS. 25 and 26 are diagrams showing the structure of a boundary region between the element region 104 and the termination region 105 of the MOSFET 400. FIGS. 25 and 26 are diagrams showing, for example, the structure of a region Y in FIG. 24B.

In addition, the structure of the element region 104 of the MOSFET 400 is the same as, for example, that of the semiconductor device of the first embodiment or the second embodiment. For example, the structure of the region Z in FIG. 24B is the same as that in the semiconductor device of the first embodiment or the second embodiment.

The MOSFET 400 includes a substrate insulating layer 50. The substrate insulating layer 50 is provided in the termination region. The substrate insulating layer 50 is provided between the end gate electrode connection line 107 and the silicon carbide layer 10. The thickness of the substrate insulating layer 50 is larger than the thickness of the gate insulating layer 16, for example.

The substrate insulating layer 50 contains, for example, silicon oxide. The substrate insulating layer 50 is, for example, a silicon oxide layer.

The gate electrode 18 includes a first gate electrode 18a and a second gate electrode 18b. The first gate electrode 18a extends in the first direction of the second gate electrode 18b.

The end gate electrode connection line 107 extends in the first direction. The end gate electrode connection line 107 is provided in the second direction of the second gate electrode 18b. The second gate electrode 18b is provided between the first gate electrode 18a and the end gate electrode connection line 107. The width (w3 in FIG. 25) of the end gate electrode connection line 107 in the second direction is larger than the width (w4 in FIG. 25) of the gate electrode 18 in the second direction.

The source electrode 12 includes a contact electrode portion 12x and a diode electrode portion 12y. The contact electrode portion 12x includes a first contact electrode portion 12x1 (first portion). The diode electrode portion 12y includes a first diode electrode portion 12y1 (second portion) and a second diode electrode portion 12y2 (third portion).

The source electrode 12 is an example of the first electrode. The first contact electrode portion 12x1 is an example of the first portion. The first diode electrode portion 12y1 is an example of the second portion. The second diode electrode portion 12y2 is an example of the third portion.

The first contact electrode portion 12x1 and the first diode electrode portion 12y1 are provided between the first gate electrode 18a and the second gate electrode 18b. The second diode electrode portion 12y2 is provided between the second gate electrode 18b and the end gate electrode connection line 107.

The second diode electrode portion 12y2 is in contact with the silicon carbide layer 10 on the first face F1. The second diode electrode portion 12y2 is in contact with the drift region 24 on the first face F1.

The length of the second diode electrode portion 12y2 in the first direction is larger than the length of the first diode electrode portion 12y1 in the first direction, for example.

The silicon carbide layer 10 includes a second resurf region of p-type 42 (fifth silicon carbide region). The second resurf region 42 is an example of the fifth silicon carbide region.

The second resurf region 42 is provided between the end gate electrode connection line 107 and the drift region 24. The second resurf region 42 is provided between the substrate insulating layer 50 and the drift region 24.

The second resurf region 42 has a function of reducing the strength of the electric field applied to the end of the element region 104 to increase the breakdown voltage of the MOSFET 400.

The second resurf region 42 contains, for example, aluminum (Al) as a p-type impurity. The p-type impurity concentration in the second resurf region 42 is equal to or more than $5 \times 10^{16}$ cm$^{-3}$ and equal to or less than $5 \times 10^{19}$ cm$^{-3}$, for example.

The depth of the second resurf region 42 is equal to or more than 500 nm and equal to or less than 900 nm, for example.

The second resurf region 42 is electrically connected to the source electrode 12. The first resurf region 40 is fixed to the electric potential of the source electrode 12.

A part of the second resurf region 42 is in contact with the first face F1. A part of the second resurf region 42 faces the end gate electrode connection line 107.

In the MOSFET 400, the source electrode 12 interposed between the end gate electrode connection line 107 and the gate electrode 18 at the end in the second direction and in contact with the silicon carbide layer 10 does not include the metal silicide layer 12s. The source electrode 12 interposed between the end gate electrode connection line 107 and the gate electrode 18 at the end in the second direction and in contact with the silicon carbide layer 10 does not include the metal silicide layer 12s in all the portions in the first direction. In the MOSFET 400, the source electrode 12 interposed between the end gate electrode connection line 107 and the gate electrode 18 at the end in the second direction is not in contact with any of the body contact region 28 and the source region 30, for example. The source electrode 12 interposed between the end gate electrode connection line 107 and the gate electrode 18 at the end in the second direction is in contact with the drift region 24.

For example, the second diode electrode portion 12y2 interposed between the end gate electrode connection line 107 and the second gate electrode 18b at the end in the second direction and in contact with the drift region 24 does not include the metal silicide layer 12s.

Next, the function and effect of the semiconductor device of the fourth embodiment will be described.

Figure 27:
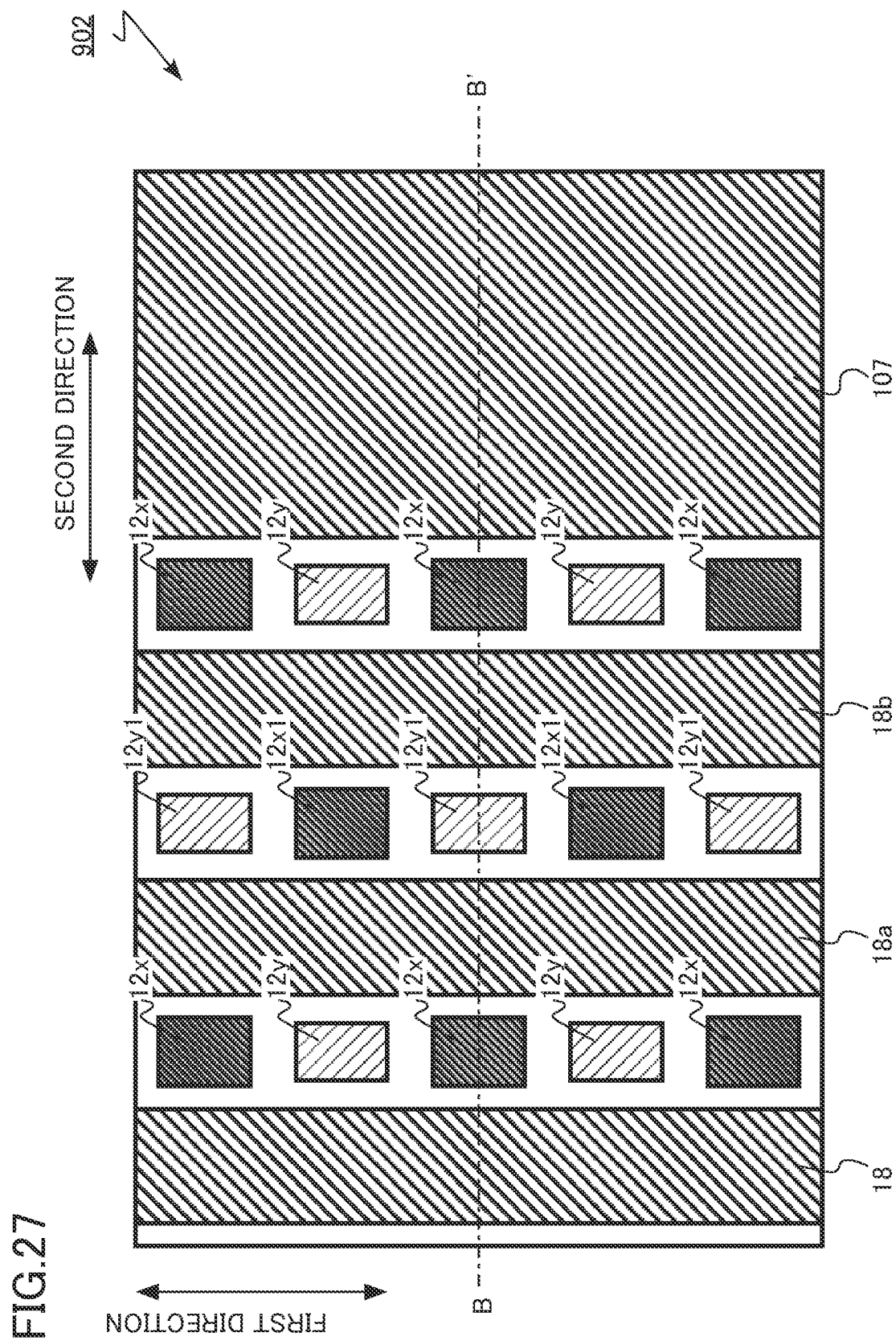
FIG. 27 is a schematic top view of a semiconductor device of a comparative example of the fourth embodiment.
Figure 28:
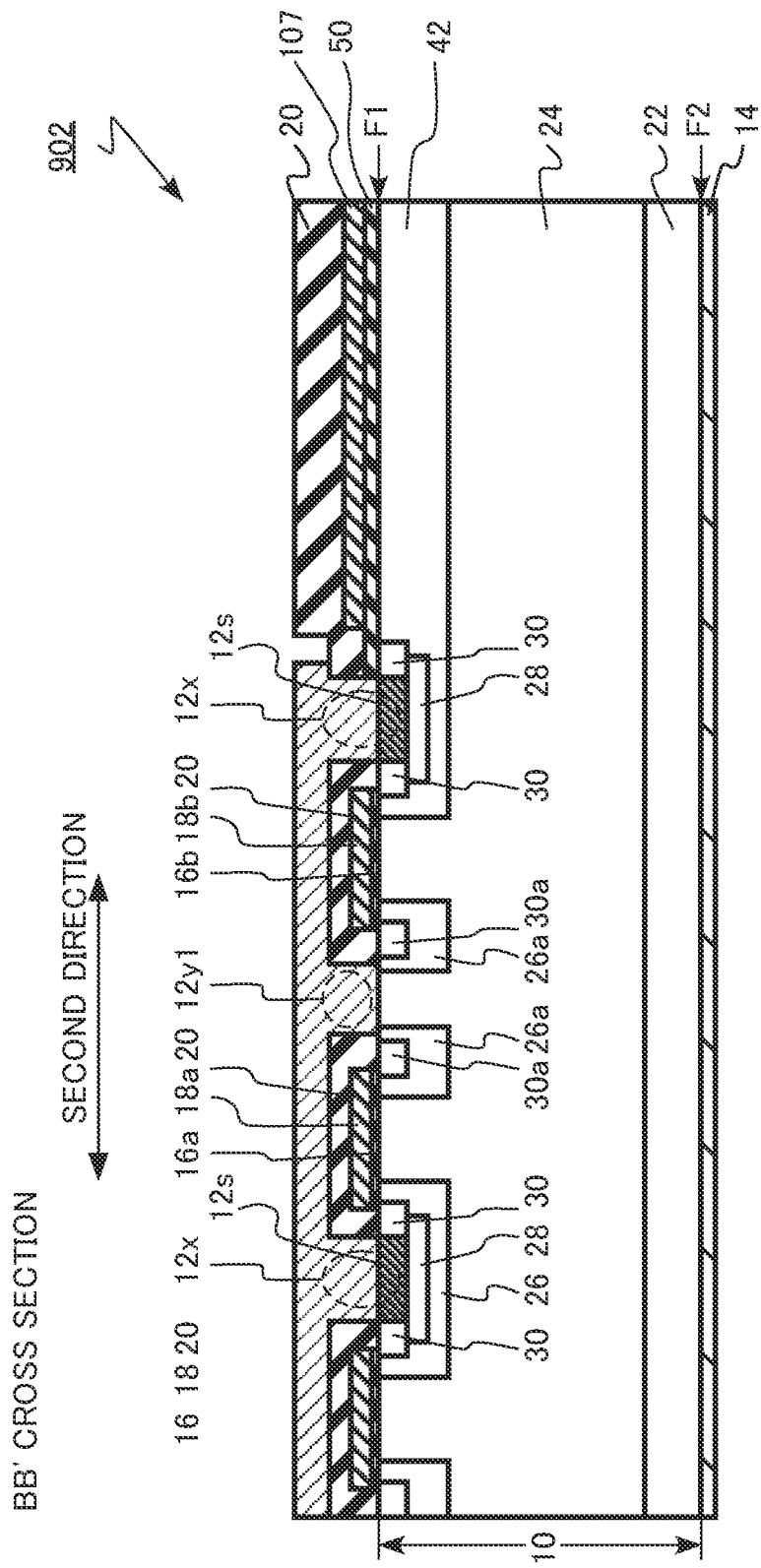
FIG. 28 is a schematic cross-sectional view of a semiconductor device of a comparative example of the fourth embodiment.

FIG. 27 is a schematic top view of a semiconductor device of a comparative example of the fourth embodiment. FIG. 27 is a schematic diagram showing a pattern of a gate electrode and a source electrode on the top surface of a silicon carbide layer. FIG. 28 is a schematic cross-sectional view of a semiconductor device of a comparative example of the fourth embodiment. FIG. 28 is a cross-sectional view taken along the line BB' of FIG. 27. FIG. 27 is a diagram corresponding to FIG. 25 of the fourth embodiment. FIG. 28 is a diagram corresponding to FIG. 26 of the fourth embodiment.

The semiconductor device of the comparative example is a planar gate type vertical MOSFET 902 using silicon carbide.

The MOSFET 902 of the comparative example is different from the MOSFET 400 of the fourth embodiment in that the source electrode 12 interposed between the end gate electrode connection line 107 and the gate electrode 18 at the end in the second direction and in contact with the silicon carbide layer 10 includes the metal silicide layer 12s. In the MOSFET 902, at least a part of the source electrode 12 interposed between the end gate electrode connection line 107 and the gate electrode 18 at the end in the second direction is in contact with both the body contact region 28 and the source region 30.

For example, the contact electrode portion 12x interposed between the end gate electrode connection line 107 and the second gate electrode 18b at the end in the second direction and in contact with the drift region 24 includes the metal silicide layer 12s. The contact electrode portion 12x interposed between the end gate electrode connection line 107 and the second gate electrode 18b at the end in the second direction and in contact with the drift region 24 is in contact with both the body contact region 28 and the source region 30.

In the MOSFET having a built-in SBD, when the SBD is forward-biased, the current flowing through the SBD flows through the bottom of the second resurf region 42, so that the increase in the voltage applied to the pn junction between the second resurf region 42 and the drift region 24 is suppressed. By suppressing the increase in the voltage applied to the pn junction, the pn junction diode is suppressed from being turned on. By suppressing the pn junction diode from being turned on, the injection of holes from the body region 26 into the drift region 24 is suppressed. In the MOSFET having a built-in SBD, by suppressing the holes injected into the drift region 24, the growth of a stacking fault in the silicon carbide layer is suppressed, and accordingly, a reduction in reliability is suppressed.

When the distance from the SBD to the second resurf region 42 increases, the increase in the voltage applied to the pn junction cannot be sufficiently suppressed, so that the pn junction diode is easily turned on. Therefore, the reliability may be reduced.

In the MOSFET 902 of the comparative example, the contact electrode portion 12x is provided between the second gate electrode 18b and the end gate electrode connection line 107. Therefore, the distance from the SBD to the second resurf region 42 increases. Alternatively, the area of the SBD near the second resurf region 42 decreases. Therefore, there is a concern that the pn junction diode will be turned on to reduce the reliability of the MOSFET 902.

In the MOSFET 400 of the fourth embodiment, the contact electrode portion 12x is not provided between the second gate electrode 18b and the end gate electrode connection line 107. Therefore, the distance from the SBD to the second resurf region 42 is smaller than that in the MOSFET 902 of the comparative example. Alternatively, the area of the SBD near the second resurf region 42 increases. Therefore, the pn junction diode is suppressed from being turned on. As a result, the reliability of the MOSFET 400 is improved.

As described above, according to the fourth embodiment, a MOSFET with improved reliability is realized.

In the first to fourth embodiments, the case of 4H—SiC has been described as an example of the crystal structure of SiC. However, embodiments can also be applied to devices using SiC having other crystal structures, such as 6H—SiC and 3C—SiC. In addition, a face other than the (0001) face can also be applied as the surface of the silicon carbide layer 10.

In the first to fourth embodiments, the case where the first conductive type is n-type and the second conductive type is p-type has been described as an example. However, the first conductive type can be p-type and the second conductive type can be n-type.

In the first to fourth embodiments, aluminum (Al) is exemplified as a p-type impurity, but boron (B) can also be used. In addition, although nitrogen (N) and phosphorus (P) are exemplified as n-type impurities, arsenic (As), antimony (Sb), and the like can also be applied.

In addition, embodiments can be applied to an insulated gate bipolar transistor (IGBT).

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
a silicon carbide layer having a first face and a second face facing the first face and including:
a first silicon carbide region of a first conductive type including a first region in contact with the first face;
a second silicon carbide region of a second conductive type provided between the first silicon carbide region and the first face;
a third silicon carbide region of the second conductive type provided between the second silicon carbide region and the first face and having a second conductive type impurity concentration higher than a second conductive type impurity concentration in the second silicon carbide region; and
a fourth silicon carbide region of the first conductive type provided between the second silicon carbide region and the first face and in contact with the first face;
a plurality of gate electrodes provided on a side of the first face of the silicon carbide layer, each of the plurality of gate electrodes extending in a first direction parallel to the first face, the plurality of gate electrodes being arranged in a second direction parallel to the first face and perpendicular to the first direction with separation from each other in the second direction, the plurality of gate electrodes including:
a first gate electrode facing the second silicon carbide region on the first face; and
a second gate electrode adjacent to the first gate electrode in the second direction, and facing the second silicon carbide region on the first face;
a first gate insulating layer provided between the second silicon carbide region and the first gate electrode;
a second gate insulating layer provided between the second silicon carbide region and the second gate electrode;
a first electrode provided on the side of the first face of the silicon carbide layer and including:
a first portion provided between the first gate electrode and the second gate electrode and in contact with the third silicon carbide region and the fourth silicon carbide region; and
a second portion provided between the first gate electrode and the second gate electrode, provided in the first direction of the first portion, and in contact with the first region; and
a second electrode provided on a side of the second face of the silicon carbide layer.

2. The semiconductor device according to claim 1, further comprising:
a third gate insulating layer
wherein the plurality of gate electrodes further includes:
a third gate electrode adjacent to the second gate electrode in the second direction, the second gate electrode being provided between the first gate electrode and the third gate electrode,
the silicon carbide layer includes:
a fifth silicon carbide region of the second conductive type provided between the first silicon carbide region and the first face and spaced from the second silicon carbide region in the second direction;
a sixth silicon carbide region of the second conductive type provided between the fifth silicon carbide region and the first face and having the second conductive type impurity concentration higher than that in the fifth silicon carbide region; and
a seventh silicon carbide region of the first conductive type provided between the fifth silicon carbide region and the first face and in contact with the first face,
the second gate electrode faces the fifth silicon carbide region on the first face,
the second gate insulating layer is provided between the fifth silicon carbide region and the second gate electrode,
the third gate electrode faces the fifth silicon carbide region on the first face,
the third gate insulating layer is provided between the fifth silicon carbide region and the third gate electrode,
the first electrode further includes a third portion provided between the second gate electrode and the third gate electrode and in contact with the sixth silicon carbide region and the seventh silicon carbide region, and
the third portion is disposed in the second direction of the second portion.

3. The semiconductor device according to claim 2,
wherein the first silicon carbide region further includes a second region in contact with the first face, and
the first electrode further includes a fourth portion provided between the second gate electrode and the third gate electrode, provided in the first direction of the third portion, and in contact with the second region.

4. The semiconductor device according to claim 1,
wherein the fourth silicon carbide region is provided between the third silicon carbide region and the first face,
an interface between the first portion and the third silicon carbide region is disposed closer to the second face than the first face in a third direction perpendicular to the first face, and
the first portion is in contact with the fourth silicon carbide region in the second direction.

5. The semiconductor device according to claim 1,
wherein the first electrode further includes a metal silicide layer, and
the first portion includes the metal silicide layer.

6. The semiconductor device according to claim 1,
wherein the plurality of gate electrodes has stripe pattern.

7. A semiconductor device, comprising:
a silicon carbide layer having a first face and a second face facing the first face and including:
a first silicon carbide region of a first conductive type in contact with the first face;
a second silicon carbide region of a second conductive type provided between the first silicon carbide region and the first face;
a third silicon carbide region of the second conductive type provided between the second silicon carbide region and the first face and having a second conductive type impurity concentration higher than a second conductive type impurity concentration in the second silicon carbide region;
a fourth silicon carbide region of the first conductive type provided between the second silicon carbide region and the first face and in contact with the first face;
a fifth silicon carbide region of the second conductive type provided between the first silicon carbide region and the first face and spaced from the second silicon carbide region;
a sixth silicon carbide region of the second conductive type provided between the fifth silicon carbide region and the first face and having a second conductive type impurity concentration higher than a second conductive type impurity concentration in the fifth silicon carbide region; and
a seventh silicon carbide region of the first conductive type provided between the fifth silicon carbide region and the first face and in contact with the first face;
a plurality of gate electrodes provided on a side of the first face of the silicon carbide layer, each of the plurality of gate electrodes extending in a first direction parallel to the first face, the plurality of gate electrodes being arranged in a second direction parallel to the first face and perpendicular to the first direction with separation from each other in the second direction, the plurality of gate electrodes including:
  a first gate electrode facing the second silicon carbide region on the first face; and
  a second gate electrode adjacent to the first gate electrode in the second direction, and facing the second silicon carbide region on the first face;
a third gate electrode provided on the side of the first face of the silicon carbide layer, extending in the first direction, provided in the second direction with respect to the second gate electrode, and facing the fifth silicon carbide region on the first face, the second gate electrode being provided between the first gate electrode and the third gate electrode;
a first gate insulating layer provided between the second silicon carbide region and the first gate electrode;
a second gate insulating layer provided between the second silicon carbide region and the second gate electrode and between the fifth silicon carbide region and the second gate electrode;
a third gate insulating layer provided between the fifth silicon carbide region and the third gate electrode;
a first electrode provided on the side of the first face of the silicon carbide layer and including:
  a first portion provided between the first gate electrode and the second gate electrode and in contact with the third silicon carbide region and the fourth silicon carbide region;
  at least one second portion provided between the first gate electrode and the second gate electrode, provided in the first direction of the first portion, and in contact with the first silicon carbide region on the first face;
  a third portion provided between the second gate electrode and the third gate electrode and in contact with the sixth silicon carbide region and the seventh silicon carbide region; and
  at least one fourth portion provided between the second gate electrode and the third gate electrode, provided in the first direction of the third portion, and in contact with the first silicon carbide region on the first face;
a second electrode provided on a side of the second face of the silicon carbide layer; and
a conductive layer provided in the first direction of the first gate electrode, extending in the second direction, connected to the first gate electrode, the second gate electrode, and the third gate electrode, and formed of the same material as the first gate electrode,
wherein the silicon carbide layer further includes an eighth silicon carbide region of the second conductive type provided between the first silicon carbide region and the conductive layer and electrically connected to the first electrode,
the first electrode further includes a metal silicide layer,
the first electrode does not include the metal silicide layer between the conductive layer and the at least one second portion closest to the conductive layer, and
the first electrode does not include the metal silicide layer between the conductive layer and the at least one fourth portion closest to the conductive layer.

8. The semiconductor device according to claim 7, wherein the first portion and the third portion include the metal silicide layer.

9. The semiconductor device according to claim 7, wherein the plurality of gate electrodes has stripe pattern.

10. A semiconductor device, comprising:
a silicon carbide layer having a first face and a second face facing the first face and including:
  a first silicon carbide region of a first conductive type in contact with the first face;
  a second silicon carbide region of a second conductive type provided between the first silicon carbide region and the first face;
  a third silicon carbide region of the second conductive type provided between the second silicon carbide region and the first face and having a second conductive type impurity concentration higher than a second conductive type impurity concentration in the second silicon carbide region; and
  a fourth silicon carbide region of the first conductive type provided between the second silicon carbide region and the first face and in contact with the first face;
a plurality of gate electrodes provided on a side of the first face of the silicon carbide layer, each of the plurality of gate electrodes extending in a first direction parallel to the first face, the plurality of gate electrodes being arranged in a second direction parallel to the first face and perpendicular to the first direction with separation from each other in the second direction, the plurality of gate electrodes including:
  a first gate electrode facing the second silicon carbide region on the first face; and
  a second gate electrode adjacent to the first gate electrode in the second direction, and facing the second silicon carbide region on the first face;
a first gate insulating layer provided between the second silicon carbide region and the first gate electrode;
a second gate insulating layer provided between the second silicon carbide region and the second gate electrode;
a first electrode provided on the side of the first face of the silicon carbide layer and including:
  a first portion provided between the first gate electrode and the second gate electrode and in contact with the third silicon carbide region and the fourth silicon carbide region; and
  a second portion provided between the first gate electrode and the second gate electrode, provided in the first direction of the first portion, and in contact with the first silicon carbide region on the first face;
a second electrode provided on a side of the second face of the silicon carbide layer; and
a conductive layer provided in the second direction of the second gate electrode, extending in the first direction, having a width in the second direction larger than a width of the second gate electrode in the second direction, and formed of the same material as the second gate electrode, wherein the silicon carbide layer further includes a fifth silicon carbide region of the second conductive type provided between the first silicon carbide region and the conductive layer and electrically connected to the first electrode,
the first electrode further includes a metal silicide layer,
the first electrode further includes a third portion provided between the second gate electrode and the conductive layer and in contact with the silicon carbide layer, and
the third portion does not include the metal silicide layer.

11. The semiconductor device according to claim 10, wherein the first portion includes the metal silicide layer.

12. The semiconductor device according to claim 10, wherein the plurality of gate electrodes has stripe pattern.

* * * * *